United States Patent [19]

Imamura et al.

[11] Patent Number: 5,677,551
[45] Date of Patent: Oct. 14, 1997

[54] SEMICONDUCTOR OPTICAL DEVICE AND AN OPTICAL PROCESSING SYSTEM THAT USES SUCH A SEMICONDUCTOR OPTICAL SYSTEM

[75] Inventors: Kenichi Imamura; Naoki Yokoyama, both of Kawasaki, Japan

[73] Assignee: Fujitsu Limited, Kawasaki, Japan

[21] Appl. No.: 516,282

[22] Filed: Aug. 17, 1995

[30] Foreign Application Priority Data

Nov. 15, 1994 [JP] Japan .................................. 6-280141
Dec. 27, 1994 [JP] Japan .................................. 6-324905

[51] Int. Cl.$^6$ ........................... H01L 33/00; H01L 31/00
[52] U.S. Cl. ......................... 257/95; 257/96; 257/187; 257/462; 257/466
[58] Field of Search ........................ 257/95, 103, 462, 257/466, 571, 586, 197, 198, 98, 94, 96, 97, 187, 184

[56] References Cited

U.S. PATENT DOCUMENTS 3,593,067 7/1971 Flynn .................................. 257/466 X
5,461,245 10/1995 Gribnikov et al. .................. 257/197
5,561,306 10/1996 Imamura et al. .................... 257/197

FOREIGN PATENT DOCUMENTS 61-93663 5/1986 Japan .................................. 257/462
5048139 2/1993 Japan .................................. 257/462

*Primary Examiner*—William Mintel
*Attorney, Agent, or Firm*—Armstrong, Westerman, Hattori, McLeland & Naughton

[57] ABSTRACT

A photodetection device includes a collector layer, a collector electrode connected electrically to the collector layer, a base layer free from a junction region for contacting with an electrode, an emitter layer including at least two, mutually separated emitter regions; and at least two emitter electrodes provided respectively on the emitter regions, wherein the base layer is exposed optically to an external optical radiation.

23 Claims, 28 Drawing Sheets

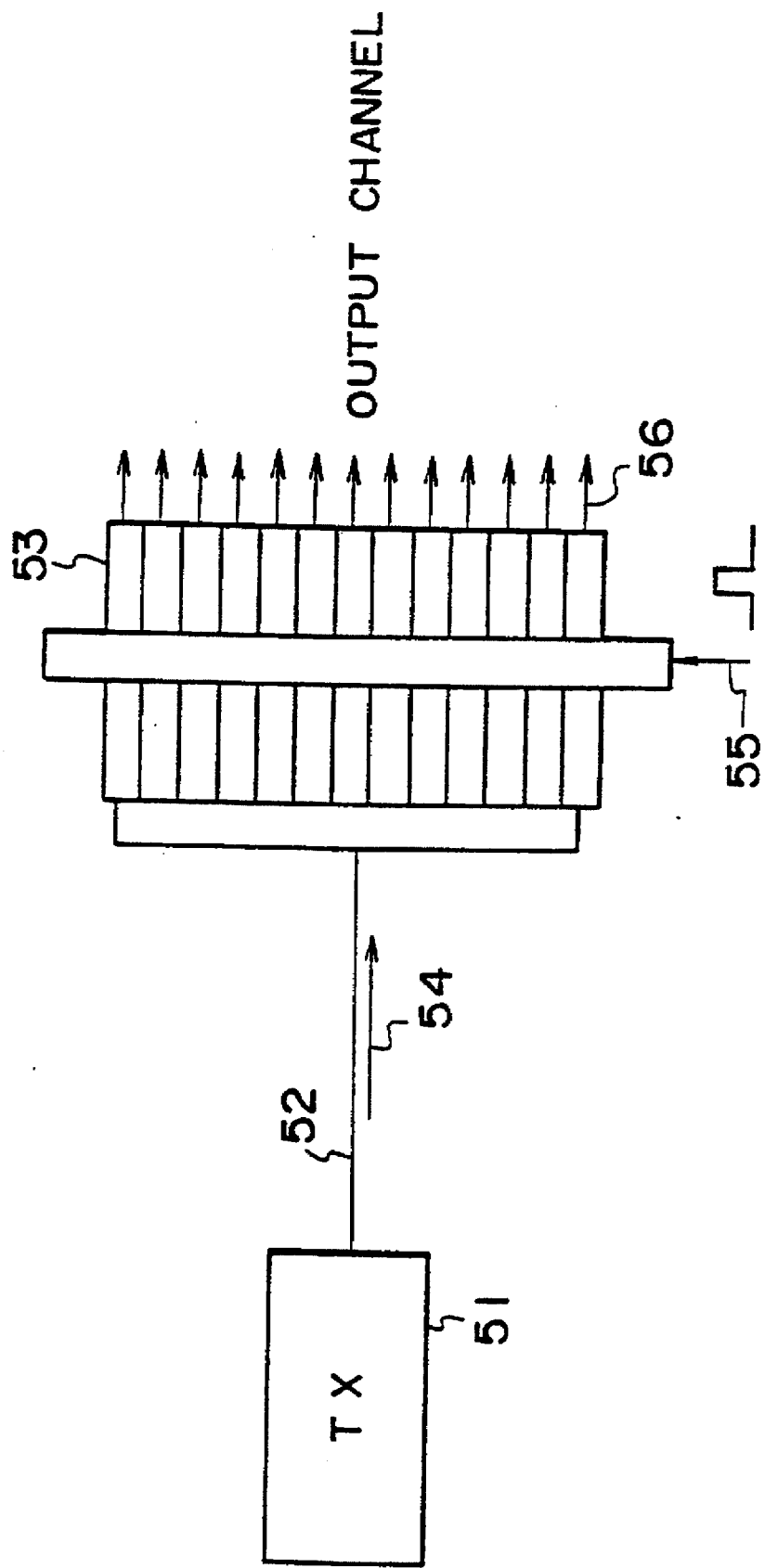

SEMICONDUCTOR OPTICAL DEVICE AND AN OPTICAL PROCESSING SYSTEM THAT USES SUCH A SEMICONDUCTOR OPTICAL SYSTEM

BACKGROUND OF THE INVENTION

The present invention generally relates to the art of optical information processing and more particularly to an optical semiconductor device as well as to an optical processing system that uses such an optical semiconductor device.

With the persisting demand for high speed semiconductor devices, intensive efforts have been made for developing high speed compound semiconductor devices and integrated circuits thereof that have an operational speed exceeding the operational speed of conventional Si devices. A hot electron transistor (HET) is a representative example of such a high speed compound semiconductor device. Particularly, it is noted that there is a proposal for a multiple emitter HET that includes a plurality of emitters.

Further, the inventor of the present invention has proposed a multiple emitter heterobipolar transistor (HBT) having a structure somewhat similar to that of the multiple emitter HET in the U.S. Pat. No. 5,561,306 patent application Ser. No. 08/295,538). In the proposed device, the base electrode is eliminated, and two different emitter regions are defined on a common emitter layer for carrying first and second emitter electrodes respectively. Thereby, one of the emitter electrodes is used for removing holes accumulated in the base layer. In the proposed device, the impurity concentration level of the n-type emitter is set to about $2 \times 10^{18} \text{cm}^{-3}$, which is substantially larger than the effective density of state of electrons ($\approx 5 \times 10^{17} \text{cm}^{-3}$) in the emitter. Simultaneously, the impurity concentration level of the p-type base is set to about $1 \times 10^{19} \text{cm}^{-3}$, which is substantially larger than the effective density of state of holes ($\approx 1 \times 10^{19} \text{cm}^{-3}$) in the base. By setting the impurity concentration level of the emitter and base as such, it is possible to reduce the base resistance of the device significantly by removing the holes from the base by tunneling through the depletion region formed at the base-emitter junction, and one obtains a high speed semiconductor device. It should be noted that such a HBT has a distinct advantage over conventional HETs (that operate only in a very low temperature environment) they are operational also at a room temperature environment.

Meanwhile, there is a rapid development in the field of super high speed optical telecommunication networks, particularly in relation to the so-called multimedia applications. In order to realize a high speed, large capacity telecommunication network, it is not only necessary to use optical fibers in place of electric cables but also necessary to increase the transmission rate of the optical fibers from the conventional rate of 1 Gbit/s to at least 4 Gbit/s, and preferably larger than 10 Gbit/s.

When the transmission rate of the optical signals through the optical fiber network is increased as such, there naturally arises a demand for a photoreception device that responds to such a very high speed optical signals. Further, there exists various demands for other associated circuits such as a high speed preamplifier for amplifying the high frequency electric signals obtained by the photoreception device or a demultiplexer for extracting signals of desired channels from a multiplexed optical signal by conducting a demultiplexing process and for transmitting the same with a lower transmission rate.

FIG. 1 shows the construction of a conventional optical receiver including a demultiplexer.

Referring to FIG. 1, the optical receiver includes a photoreception device 103 such as a PIN diode that receives an optical signal from an optical transmitter 101 via an optical fiber 102, wherein the photoreception device 103 produces an electric output signal and supplies the same to a preamplifier 104 typically formed of a high speed transistor for amplification. The electric signal thus amplified in turn is supplied to a demultiplexer 105 for demultiplexing into electric signals of respective channels.

Generally, such an optical receiver has a drawback in that it requires a complex construction. Further, there is a drawback in that, while the PIN photodiode used for the photoreception device may have a sufficiently high response speed, the overall response of the optical receiver may be limited by the response of the preamplifier 104 or the demultiplexer 105. Thus, there has been a demand for a high speed optical receiver that has a simple construction and provides a high response speed suitable for processing high speed optical signals.

SUMMARY OF THE INVENTION

Accordingly, it is a general object of the present invention to provide an optical semiconductor device as well as an integrated circuit thereof, wherein the foregoing problems are successfully eliminated.

Another and more specific object of the present invention is to provide a high speed optical semiconductor device having a simple structure based upon a multiple emitter HBT as well as an optical integrated circuit thereof.

Another object of the present invention is to provide a signal extraction or sampling process that uses a high speed optical semiconductor device based upon a multiple emitter HBT.

Another object of the present invention is to provide an electro-optical logic gate that performs a logic operation of an input optical signal and an input electric signal both having a logic level.

Another object of the present invention is to provide a light emitting device, comprising:

a collector layer;

a collector electrode connected electrically to said collector layer;

a base layer provided on said collector layer, said base layer being free from a junction region for contacting with an electrode;

an emitter layer provided on said base layer, said emitter layer including at least two, mutually separated emitter regions; and at least two emitter electrodes provided respectively on said at least two emitter regions.

According to the present invention, it is possible to cause an optical emission at the p-n junction formed between each of the emitter regions and the base layer by applying a voltage across the plurality of emitter regions, such that a recombination of electrons and holes occurs at the p-n junction. As the thin base layer is free from a base electrode, the fabrication of the device is substantially facilitated.

Another object of the present invention is to provide a photodetection device, comprising:

a collector layer;

a collector electrode connected electrically to said collector layer;

a base layer provided on said collector layer, said base layer being free from a junction region for contacting with an electrode;

an emitter layer provided on said base layer, said emitter layer including at least two, mutually separated emitter regions; and at least two emitter electrodes provided respectively on said at least two emitter regions;

said base layer being exposed optically to an external optical radiation.

According to the present invention, it is possible to detect an optical beam incident to the base layer by detecting a current flowing between the plurality of emitter regions. In response to the optical radiation applied to the base layer of the device, electrons and holes are excited in the base layer, wherein the thus excited electrons escape immediately to the emitter regions, leaving an accumulation of holes in the base layer. With an increasing degree of accumulation of holes in the base layer, the energy level of the base layer shifts in the lower direction with respect to the emitter regions for both the conduction band and valence band. Ultimately, the energy level of the valence band in the base layer becomes equal to the energy level of the valence band of the emitter regions, and the holes cause an escape from the base layer to the emitter regions, and a current flows between the plurality of emitter regions.

Alternatively, one may apply a bias voltage between one of the emitter regions and the collector layer for detecting the incident optical beam. In the latter operational mode, the electrons excited in the base layer as a result of optical radiation escape immediately to the collector layer to form a collector current, leaving an accumulation of holes in the base layer. In the present invention, one can annihilate such accumulation of holes in the base layer by injecting electrons into the base layer from another emitter region. Thereby, the photodetection device recovers the original operational state immediately whenever the incident optical beam is interrupted.

In any of the foregoing operational modes, the thin base layer is free from a base electrode. Thus, the fabrication of the device is substantially facilitated.

Another object of the present invention is to provide a method for detecting an optical beam by a photodetection device, said photodetection device including: a collector layer; a collector electrode connected electrically to said collector layer; a base layer provided on said collector layer, said base layer being free from a junction region for contacting with an electrode; an emitter layer provided on said base layer, said emitter layer including at least two, mutually separated emitter regions; and at least two emitter electrodes provided respectively on said at least two emitter regions; said base layer being exposed optically to an external optical radiation, said method comprising the steps of:

applying a bias voltage across two of said emitter electrodes; and applying an optical beam to said base layer as said external optical radiation, with an optical energy exceeding a bandgap of said base layer.

Another object of the present invention is to provide a method for detecting an optical beam by a photodetection device, said photodetection device including: a collector layer; a collector electrode connected electrically to said collector layer; a base layer provided on said collector layer, said base layer being free from a junction region for contacting with an electrode; an emitter layer provided on said base layer, said emitter layer including at least two, mutually separated emitter regions; and at least two emitter electrodes provided respectively on said at least two emitter regions; said base layer being exposed optically to an external optical radiation, said method comprising the steps of:

applying a bias voltage across one of said emitter electrodes and said collector electrode;

applying an optical beam to said base layer as said external optical radiation, with an optical energy exceeding a bandgap of said base layer; and after interrupting said optical beam, injecting electrons from another emitter electrode to said base layer so as to cancel out accumulation of holes in said base layer.

According to the present invention, one can annihilate such accumulation of holes in the base layer by injecting electrons into the base layer from another emitter region. Thereby, the photodetection device recovers the original operational state immediately whenever the incident optical beam is interrupted.

In any of the foregoing operational modes, the thin base layer is free from a base electrode. Thus, the fabrication of the device is substantially facilitated.

Another object of the present invention is to provide an electro-optical logic device, comprising:

a semiconductor device having a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said base layer being exposed optically to an external optical radiation;

an optical window provided on said semiconductor device for injecting an input optical logic signal to said base layer; and an input terminal connected to one of said emitter electrodes for supplying an input electric logic signal thereto; and an output terminal connected to said collector layer.

According to the present embodiment, one can achieve a logic operation such as a logic product or a logic sum between electric and optical logic signals.

Another object of the present invention is to provide an electro-optical sampling device, comprising:

a semiconductor device having a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said base layer being exposed optically to an external optical radiation;

an optical window provided on said semiconductor device for injecting an input optical signal to said base layer; and an input terminal connected to one of said emitter electrodes for supplying an electric clock signal thereto; and an output terminal connected to said collector layer.

According to the present invention, it is possible to carry out sampling of an input optical signal in response to an optical clock signal at high speed while using a simple construction for the sampling device.

Another object of the present invention is to provide an electro-optical sampling device, comprising:

a semiconductor device having a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said base layer being exposed optically to an external optical radiation;

an optical window provided on said semiconductor device for injecting an optical clock signal to said base layer;

an input terminal connected to one of said emitter electrodes for supplying an input electric signal thereto; and an output terminal connected to said collector layer.

According to the present invention, it is possible to sample an electric input signal in response to an optical clock signal at high speed while using a very simple construction for the sampling device.

Another object of the present invention is to provide an optical demultiplexer, comprising:

a plurality of optical semiconductor devices each including a collector layer, a base layer provided on said collector layer and an emitter layer provided on said base layer, said emitter layer including a first emitter region and a second, different emitter region;

input optical waveguide means for supplying an input electric signal to said base layer of each of said optical semiconductor devices;

each of said first emitter regions of said plurality of optical semiconductor devices being grounded commonly; and a plurality of output terminals connected to respective collector layers of said optical semiconductor devices;

each of said second emitter regions of said plurality of optical semiconductor devices being supplied with a corresponding electric pulse signal for producing an output signal at said collector thereof.

According to the present invention, it is possible to carry out a time-divisional demultiplexing of an input optical signal having a high transmission speed by a demultiplexer that has a very simple construction.

Another object of the present invention is to provide an optically controlled multiplexer, comprising:

a plurality of optical semiconductor devices each comprising a collector layer, a base layer provided on said collector layer and an emitter layer provided on said base layer, said emitter layer including a first region and a second, different region;

a plurality of input optical waveguides provided in correspondence to plurality of channels, each of said input optical waveguides supplying an optical signal of the base layer of a corresponding one of said optical semiconductor devices;

in each of said plurality of optical semiconductor devices, said first region being connected to the ground;

in each of said plurality of optical semiconductor devices, said second region being supplied with a corresponding electric timing pulse; and an output terminal connected commonly to said collector layers of said optical semiconductor devices.

According to the present invention, it is possible to produce a multiplex optical signal by a demultiplexer having a very simple construction.

Another object of the present invention is to provide an electro-optical sampling device, comprising:

a first bipolar transistor comprising a collector layer; a base layer provided on said collector layer, said base layer being free from a junction region for contacting with an electrode; and an emitter layer provided on said base layer, said emitter layer including at least first and second, mutually different emitter regions, said base layer of said optical semiconductor device being adapted for receiving an input optical signal in the form of an optical beam;

a second bipolar transistor comprising a collector layer, a base layer provided on said collector layer, and an emitter layer provided on said base layer, said emitter layer including at least first and second, mutually different emitter regions, said base layer being free from a junction region for contacting with an electrode;

a power feed path connected commonly to said first emitter region of said first bipolar transistor and said emitter layer of said second bipolar transistor for supplying electric power to both said first emitter regions via a common current source;

an input terminal connected to said second emitter region of said first bipolar transistor for supplying thereto an input electric signal;

a ground path connected commonly to said collector of said fist bipolar transistor and said collector of said second bipolar transistor for grounding the same;

an input optical path for supplying an input optical signal to the base layer of each of said first and second bipolar transistors;

an output terminal connected to said collector layer of one of said first and second bipolar transistors.

According to the present invention, it is possible to carry out a sampling of an optical signal in response to an electric clock signal while minimizing the offset in the output that appears when only one of the optical signal and the electric signal is supplied.

Another object of the present invention is to provide an electro-optical sampling device, comprising:

a first bipolar transistor comprising a collector layer; a base layer provided on said collector layer, said base layer being free from a junction region for contacting with an electrode; and an emitter layer provided on said base layer, said emitter layer including at least first and second, mutually different emitter regions, said base layer of said optical semiconductor device being adapted for receiving an input optical signal in the form of an optical beam;

a second bipolar transistor comprising a collector layer, a base layer provided on said collector layer, said base layer being free from a junction region for contacting with an electrode, and an emitter layer provided on said base layer;

a power feed path connected commonly to said first emitter region of said first bipolar transistor and said emitter layer of said second bipolar transistor for supplying electric power to both said first emitter regions via a common current source;

an input terminal connected to said second emitter region of said first bipolar transistor for supplying thereto an input electric signal;

a ground path connected commonly to said collector of said first bipolar transistor and said collector of said second bipolar transistor for grounding the same;

an input optical path for supplying an input optical signal to the base layer of each of said first and second bipolar transistors;

an output terminal connected to said collector layer of one of said first and second bipolar transistors.

According to the present invention, it is possible to carry out a sampling of an optical signal in response to an electric clock signal while minimizing the offset in the output that appears when only one of the optical signal and the electric signal is supplied, similarly as before.

Another object of the present invention is to provide a signal sampling method, comprising the steps of:

supplying an optical signal to an optical semiconductor device, said optical semiconductor device responding to both of an input electric signal and an input optical signal supplied thereto;

supplying an electric signal to said optical semiconductor device;

said optical semiconductor device being the one that produces a first output electric signal when both of said electric signal and optical signal are supplied, said optical semiconductor device further producing a second, different output electric signal when one or both said electric signal and said optical signal are not supplied;

said optical semiconductor device thereby sampling one of said optical signal and said electric signal in response to the other of said optical signal and said electric signal.

According to the present invention, one can achieve the desired sampling of a high speed input optical signal in response to an optical signal.

Another object of the present invention is to provide a method for sampling an input electric signal in response to an optical sampling pulse, comprising the steps of:

supplying electric power to a collector of a bipolar transistor, said bipolar transistor further having an open base and at least first and second emitters;

grounding said first emitter;

supplying said input electric signal to said second emitter with a frequency $nf_0$, with the parameter n being set to be an integer;

supplying said optical sampling pulse to said base layer with a clock frequency of $f_0 - {}_\Delta f$ where ${}_\Delta f$ is set to satisfy the nonequality ${}_\Delta f \ll f_0$.

According to the present invention, one can achieve a sampling of an input optical signal by a low frequency electric sampling pulse with a frequency asynchronous to the signal frequency of the optical signal. Thereby, one can extract or demodulate low frequency signal components from the input optical signal.

Another object of the present invention is to provide a method for sampling an input optical signal in response to an electric sampling pulse, comprising the steps of:

supplying electric power to a collector of a bipolar transistor, said bipolar transistor further having an open base and at least first and second emitters;

grounding said first emitter;

supplying said electric sampling pulse to said second emitter with a frequency $nf_0$, with the parameter n being set to be an integer;

supplying said optical input signal to said base layer with a clock frequency of $f_0 - {}_\Delta f$ where ${}_\Delta f$ is set to satisfy the nonequality ${}_\Delta f \ll f_0$.

According to the present invention, one can achieve a sampling of an input optical signal by a low frequency electric sampling pulse with a frequency asynchronous to the signal frequency of the optical signal. Thereby, one can extract or demodulate low frequency signal components from the input optical signal.

Another object of the present invention is to provide a method for obtaining a logic product of an input optical signal and an input electric signal, comprising the steps of:

supplying said input optical signal to a base of an optical bipolar transistor provided on a collector with an optical power selected from one of first and second logic levels, said optical bipolar transistor further including at least first and second emitters;

applying said input electric signal across said first and second emitters with a magnitude selected from one of first and second logic levels; and detecting a base current flowing between said first and second emitters;

said step of supplying said input optical signal and said step of applying said input electric signal being conducted by setting said first and second logic levels of said input optical signal and said output optical signal such that said base current flows only when both of said input optical signal and said output optical signal have said second logic level.

According to the present invention, it is possible to construct an electro-optical AND gate from a single multiple emitter HBT.

Another object of the present invention is to provide a method for obtaining a logic product of an input optical signal and an input electric signal, comprising the steps of:

supplying said input optical signal to a base of an optical bipolar transistor provided on a collector with an optical power selected from one of first and second logic levels, said optical bipolar transistor further including at least first and second emitters;

applying said input electric signal to one of said first and second emitters with a magnitude selected from one of first and second logic levels; and detecting a collector current;

said step of supplying said input optical signal and said step of applying said input electric signal being conducted by setting said first and second logic levels of said input optical signal and said output optical signal such that said collector current flows only when both of said input optical signal and said output optical signal have said second logic level.

According to the present invention, it is possible to construct an electro-optical AND gate from a single multiple emitter HBT.

Another object of the present invention is to provide a method for obtaining a logic sum of an input optical signal and an input electric signal, comprising the steps of:

supplying said input optical signal to a base of an optical bipolar transistor provided on a collector with an optical power selected from one of first and second logic levels, said optical bipolar transistor further including at least first and second emitters;

applying said input electric signal to one of said first and second emitters with a magnitude selected from one of first and second logic levels; and detecting a collector current;

said step of supplying said input optical signal and said step of applying said input electric signal being conducted by setting said first and second logic levels of said input optical signal and said output optical signal such that said collector current flows only as long as one of said input optical signal and said output optical signal has said second logic level.

According to the present invention, it is possible to construct an electro-optical OR gate from a single multiple emitter HBT.

Another object of the present invention is to provide a semiconductor device, comprising:

a plurality of bipolar transistors arranged in rows and columns, each of said bipolar transistors comprising:

a collector layer; a base layer provided on said collector layer, said collector layer being free from a junction region for contacting with an electrode; and an emitter layer provided on said base layer, said emitter layer including a first emitter region and a second emitter region; and optical waveguide means for supplying optical signals such that, in each row of said bipolar transistors, an optical signal is supplied commonly to said base layers; and said first emitter regions of said plurality of bipolar transistors being connected commonly to the ground;

in each column of said plurality of bipolar transistors, said second emitter regions being connected commonly to an input terminal;

in each row of said plurality of bipolar transistors, said collector layers being connected commonly to a power supply terminal.

According to the present invention, it is possible to construct an optical read-only memory device by selectively providing an optical mask to one or more HBT elements in the array.

Another object of the present invention is to provide a semiconductor optical integrated circuit, comprising:

a light emitting device including a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said light emitting device producing an optical beam in said base layer thereof; and a photodetection device, comprising: a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said photodetection device detecting an optical beam incident to said base layer thereof;

said light emitting device and said photodetection device being provided on a common substrate.

Another object of the present invention is to provide a semiconductor optical switch system, comprising:

a semiconductor light emitting device for emitting an optical beam; and a semiconductor photodetection device disposed for detecting said optical beam;

said semiconductor optical switch circuit comprising a collector layer, a base layer provided on said collector layer, said base layer being free from a junction region for contacting with an electrode, and an emitter layer provided on said base layer, said emitter layer including at least two, mutually separated emitter regions;

said semiconductor photodetection device comprising a collector layer, a base layer provided on said collector layer, said base layer being free from a junction region for contacting with an electrode, and an emitter layer provided on said base layer, said emitter layer including at least two, mutually separated emitter regions.

Other objects and further features of the present invention will become apparent from the following detailed description when read in conjunction with the attached drawings.

BRIEF DESCRIPTION OF THE DRAWINGS

FIG. 23 is a diagram showing the overall construction of an optical demultiplexer according to an eighteenth embodiment of the present invention;

DETAILED DESCRIPTION OF THE PREFERRED EMBODIMENTS

Figure 1:
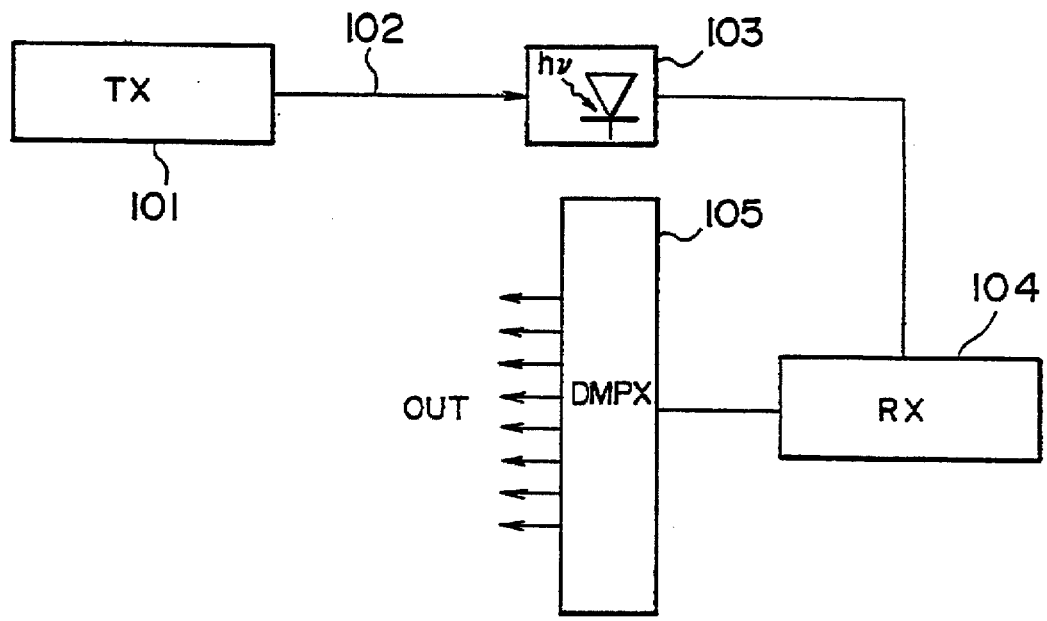
FIG. 1 is a block diagram showing the construction of a conventional transmission-reception system that uses a time-divisional multiplexing.
Figure 2:
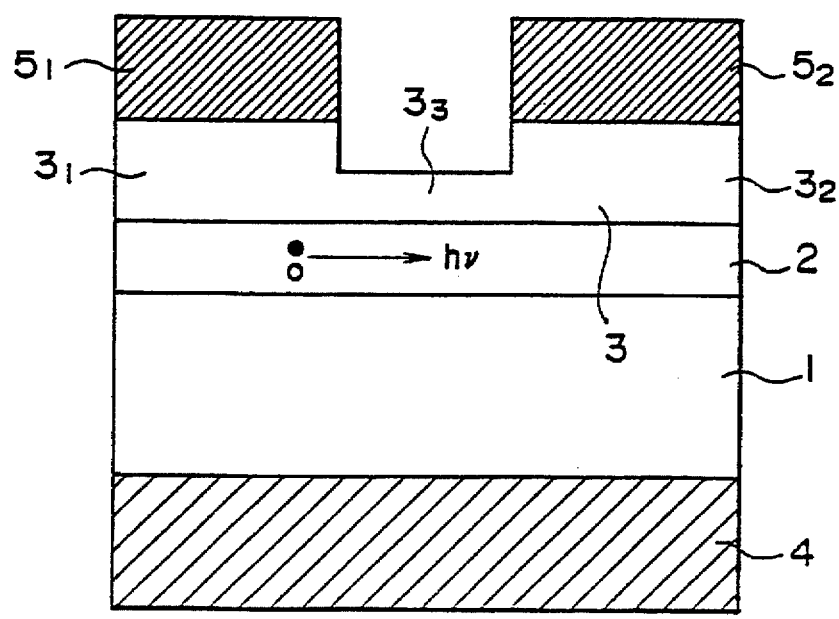
FIG. 2 is a diagram for explaining the principle of a light emitting device according to the present invention.

FIG. 2 shows the principle of a light emitting device according to the present invention. As a more detailed description is given with reference to the embodiments to be described later, only a brief summary of the operational principle of the device will be given here.

Referring to FIG. 2, the light emitting device has a structure similar to a multiple emitter bipolar transistor and includes a collector layer 1 of a first conductivity type on which a base layer 2 of a second, opposite conductivity type is provided, and an emitter layer 3 of the first conductivity type is provided further on the base layer 2 as, usual in a bipolar transistor. The bipolar transistor of the instant invention differs from the conventional bipolar transistors in that the emitter layer 3 includes a first emitter region $3_1$ and a second, different emitter region $3_2$ such that the region $3_2$ is separated from the first region $3_1$ by a thin intervening or bridging region $3_3$. It should be noted that the bridging region $3_3$ of the emitter layer 3 prevents the base layer 2 from being exposed, and thus, the base layer is protected from damage during the fabrication process of the device as well from contamination during the use of the device.

On the first and second emitter regions $3_1$ and $3_2$, first and second emitter electrodes $5_1$ and $5_2$ are provided respectively, while a collector electrode 4 is provided on the lower major surface of the collector layer 1. Thus, the light emitting device of FIG. 2 has a structure similar to that of a multiple emitter bipolar transistor proposed previously by the inventor in the U.S. Pat. No. 5,561,306 (application Ser. No. 08/295,538), op cit, which is incorporated herein as a reference. It should be noted that the device of FIG. 2 includes no base electrode. Similarly to the device of the foregoing '306 patent ('538 application), the emitter layer 3 is formed of a compound semiconductor material having a wide bandgap as compared with the semiconductor material forming the base layer.

In operation, electrons and holes are injected into the base layer 2 from the first emitter electrode $5_1$ and the second emitter electrode $5_2$, wherein the electrons and holes thus injected cause a recombination in the base layer 2 to form an optical radiation as indicated in FIG. 2 by hv. The optical radiation thus formed is emitted from an edge surface of the base layer 2.

Figure 3A:
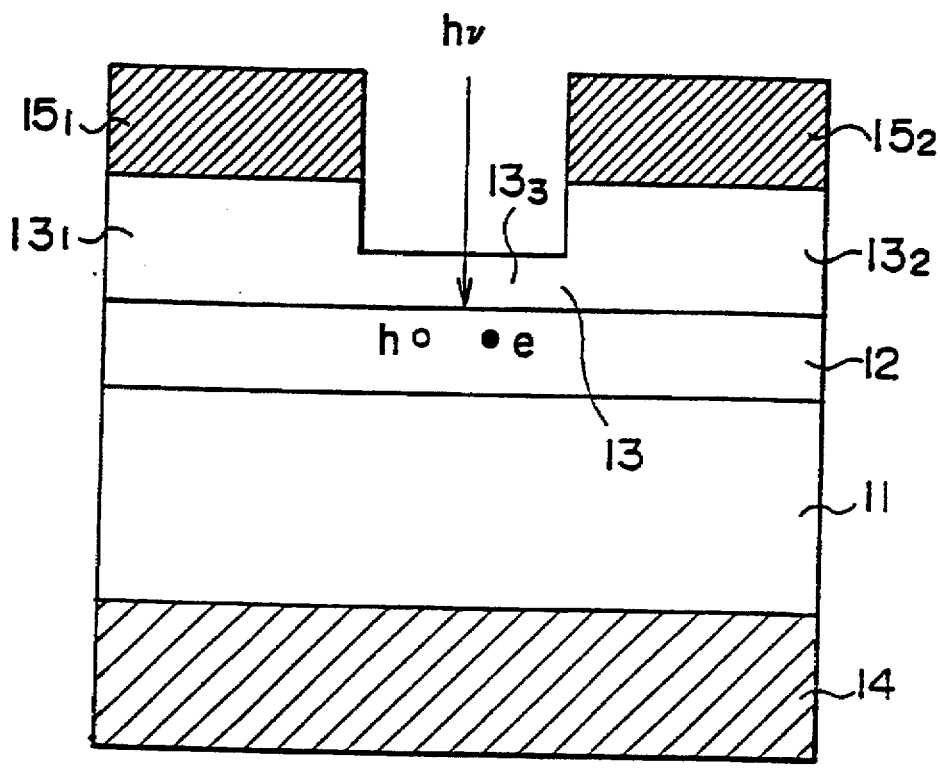
FIGS. 3A and 3B are diagrams for explaining the principle of a photodetection device according to the present invention.

FIG. 3A shows the principle of a photodetection device according to the present invention. Again, only a brief summary about the principle of the device will be given here.

Referring to FIG. 3A, the device has a structure similar to that of FIG. 2 and includes a collector layer 11 of a first conductivity type on which a base layer 12 of a second, opposite conductivity type is provided, and an emitter layer 13 of the first conductivity type is provided further on the base layer 12, as is usual in a bipolar transistor. Further, the emitter layer 13 includes a first emitter region $13_1$ and a second, different emitter region $13_2$ such that the region $13_2$ is separated from the first region $13_1$ by a thin intervening or bridging region $13_3$. In this case, too, the bridging region $13_3$ protects the surface of the base layer 12 from damage. On the emitter regions $13_1$ and $13_2$, emitter electrodes $15_1$ and $15_2$ are provided respectively, while a collector electrode 14 is provided on the lower major surface of the collector layer 11.

Figure 3B:
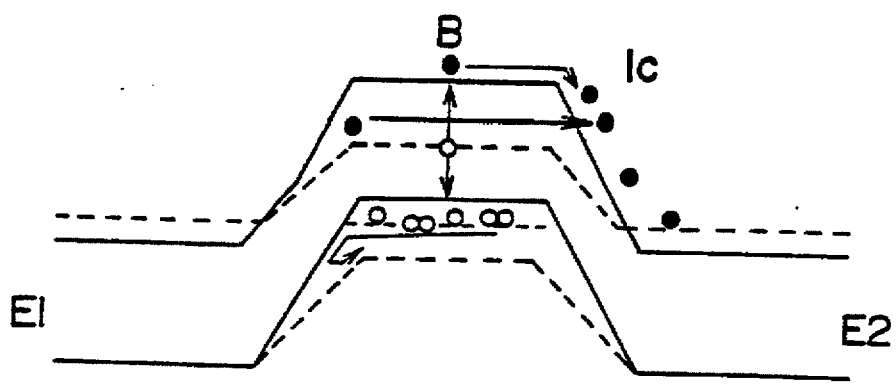

FIG. 3B shows the band structure of the device of FIG. 3A along a line passing consecutively through the first electrode $15_1$, the first emitter region $13_1$, the base layer 12, the second emitter region $13_2$ and the second electrode $15_2$, wherein the continuous line of FIG. 3B shows the state wherein no optical energy is applied to the base layer 12. In this state, it will be noted in FIG. 3B that both the bottom edge of the conduction band and the top edge of the valence band are located at an energy level higher than the energy level of any part of the bottom edge of the conduction band and the top edge of the valence band of the first and second emitter electrodes $15_1$.

When an optical energy is applied to the base layer 12 in this state with an energy exceeding the bandgap of the base layer 12, electrons and holes are excited optically, as is well known in the art, wherein the electrons thus excited occupy the conduction band of the base layer 12 while the holes occupy the valence band of the same base layer 12. Thus, by applying a bias voltage between the first emitter electrode $15_1$ and the second emitter electrode $15_2$ with a magnitude set such that no substantial current flows therebetween in the absence of any optical radiation, it will be noted that electrons excited to the conduction band escape immediately from the base layer 12 to the emitter region $13_2$ by causing a tunneling through the depletion region formed between the base layer 12 and the emitter region $13_2$. On the other hand, holes that are excited simultaneously due to the electrons are accumulated in the base layer 12. It should be noted that the base layer 12 has the top edge of the valence band at a level higher than the top edge of the valence band of either of the first and second emitter regions $13_1$ and $13_2$. As the holes are accumulated in the base layer 12 and do not reach the emitter electrode $15_1$, no current flows between the electrodes $15_1$ and $15_2$.

When such an accumulation of the holes occurs in the base layer 12, on the other hand, the energy level of the base layer 12 shifts in the downward direction as indicated in FIG. 3B by a broken line. When the level of the valence band of the base layer 12 has lowered and become equal to the level of the valence band of the emitter regions $13_1$ and $13_2$, the holes can now escape from the base layer 12 to the emitter region $13_1$. Thereby, a current flows between the emitter electrode $15_1$ and the emitter electrode $15_2$. In other words, it is possible to detect the optical radiation hv by detecting the current flowing between both emitter electrodes $15_1$ and $15_2$.

Alternatively, one may bias the device such that a bias voltage is applied between the first emitter electrode $15_1$ and the collector electrode 14. Thereby, the electrons excited as a result of the optical radiation applied to the base layer 12 escape immediately to the collector electrode 14, leaving an accumulation of the holes in the base layer 12.

One remarkable feature of the present invention, which is related to the latter operational mode, is that, by providing the second emitter region $13_2$ as well as the second emitter electrode $15_2$, one can inject electrons from the second emitter region $13_2$ to the base layer 12 so as to neutralize the excessive holes therein by causing a recombination. Thereby, the device resumes the initial state indicated by the continuous line in FIG. 3B immediately, whenever the optical radiation hv is interrupted. It should be noted that the injection of the electrons from the second emitter region $13_2$ to the base layer 12 is facilitated by increasing the impurity concentration level of the emitter region $13_2$. As a result of such an increased impurity concentration level in the emitter region $13_2$, the thickness of the depletion region formed between the base layer 12 and the emitter layer $13_2$ is substantially reduced and the inter-band tunneling of the electrons through such a depletion region is facilitated. In other words, the photodetection device of the present invention provides a very fast response.

[First Embodiment]

Figure 4:
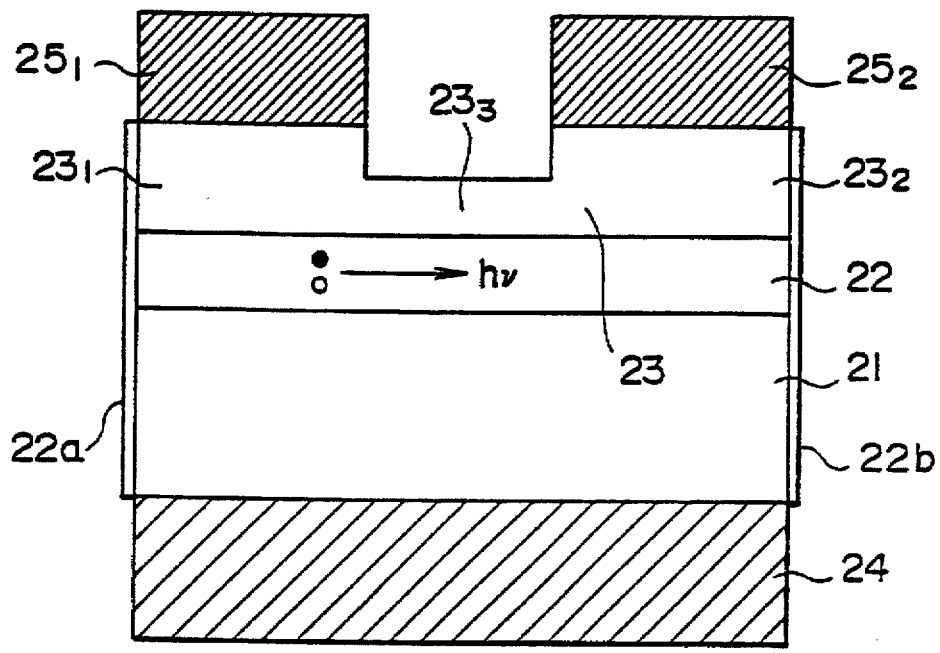
FIG. 4 is a diagram showing the construction of a light emitting device according to a first embodiment of the present invention in a cross sectional view.

FIG. 4 shows the construction of a light emitting device according to a first embodiment of the present invention.

Referring to FIG. 4, the semiconductor device includes a collector layer 21 of n-type InGaAs having a thickness of 300 nm and an impurity concentration level of $3\times10^{16} \text{cm}^{-3}$ on which a p-type base layer 22 of InGaAs is provided. The base layer 22 may have a thickness of 80 nm and an impurity concentration level of $5\times10^{19} \text{cm}^{-3}$. Further, an emitter layer 23 of n-type InGaAs is provided further on the base layer 22 with an impurity concentration level of $3\times10^{18} \text{cm}^{-3}$, wherein the emitter layer 23 includes a first emitter region $23_1$ and a second emitter region $23_2$ both having a thickness of 200 nm. Further, a collector electrode 24 of Cr/Au is provided on the lower major surface of the collector layer 21 with a thickness of 20 nm for the Cu layer and a thickness of 300 nm for the Au layer. Similarly, first and second emitter electrodes $25_1$ and $25_2$ are provided respectively on the first and second emitter regions $23_1$ and $23_2$, wherein each of the emitter electrodes includes a stacking of a Cr layer having a thickness of 20 nm and a Au layer having a thickness of 300 nm.

It should be noted that the base layer 22 is covered entirely by the emitter layer 23 by forming a bridging region $23_3$ between the emitter regions $23_1$ and $23_2$. By doing so, the base layer 22 is protected from damage during the fabrication process of the device. Further, any surface degradation during the use of the device is effectively eliminated.

In the device of FIG. 4, electrons and holes are injected to the base layer 22 by applying a voltage across the first and second emitter electrodes $25_1$ and $25_2$. The electrons and holes thus injected cause a recombination in the base layer 12, and in response to such a recombination, an optical radiation h occurs generally at the junction region between the base layer 22 and the emitter region $23_1$ and at the junction region between the base layer 22 and the emitter region $23_2$, wherein the optical radiation thus formed is emitted from an edge surface of the base layer 22. In order to facilitate optical radiation, one may provide anti-reflection coatings 22a and 22b of SiN or other suitable material on the edge surfaces of the base layer 22. Thereby, the anti-reflection coatings 22a and 22b form an optical window.

In the device of FIG. 4, it should further be noted that one can reduce the operational voltage of the device by increasing the impurity concentration level of the emitter regions $23_1$ and $23_2$ by about five times as large as the concentration level used in a HBT. By doing so, the recombination of the electrons and holes at the foregoing junction regions is facilitated and the device can show a laser oscillation when mirrors are provided on both edge surfaces of the base layer 22.

[Second Embodiment]

Figure 5:
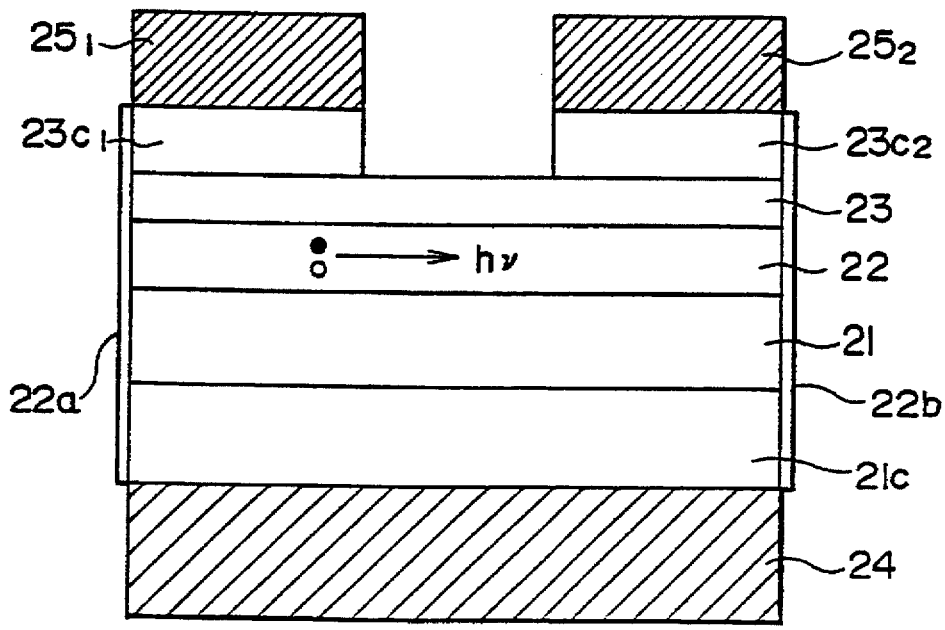
FIG. 5 is a diagram showing the construction of a light emitting device according to a second embodiment of the present invention in a cross sectional view.

FIG. 5 shows the construction of a light emitting device according to a second embodiment of the present invention. As the device of FIG. 5 has a construction similar to that of FIG. 4, those parts corresponding to the device of FIG. 5 are designated by the same reference numerals.

Referring to FIG. 5, the device includes a collector contact layer 21c of n-type InGaAs having a thickness of 300 nm and an impurity concentration level of $5\times10^{18} \text{cm}^{-3}$, and a collector layer 21 provided on the collector contact layer 21c formed as such. Similarly as before, the collector layer 21 is formed of n-type InAlAs and has a thickness of 300 nm, wherein the layer 21 of the device of FIG. 5 is doped to an impurity concentration level of $1\times10^{17} \text{cm}^{-3}$. Further, the base layer 22 of p-type InGaAs is provided on the collector layer 21 with a thickness of 70 nm and an impurity concentration level of $5\times10^{19} \text{cm}^{-3}$ similarly as before, and the emitter layer 23 of n-type InAlAs, doped to a concentration level of $3\times10^{18} \text{cm}^{-3}$ is provided further on the base layer 22 with a thickness of 200 nm. On the emitter layer 23, a first emitter contact region $23c_1$ of n-type InGaAs is provided with a thickness of 200 nm and an impurity concentration level of $5\times10^{19} \text{cm}^{-3}$ in place of the region $23_1$ of FIG. 4. Similarly, a second emitter contact region $23c_2$ is formed in place of the emitter contact region $23_2$, wherein the emitter contact region $23c_2$ is formed of n-type InGaAs doped to the impurity concentration level of $5\times10^{19} \text{cm}^{-3}$ and has a thickness of 200 nm. On the regions $23c_1$ and $23c_2$, the emitter electrodes $25_1$ and $25_2$ are provided respectively.

In this device, too, the electrons and holes cause, upon injection to the base layer 22 from the emitter electrodes $25_1$ and $25_2$ respectively, a recombination at the areas of the base-emitter junction corresponding to the emitter contact region $23c_1$ and the emitter contact region $23c_2$. As a result of such a recombination, optical radiation is produced similarly as before. The optical radiation thus formed is emitted through the anti-reflection coatings 22a and 22b at the edges of the base layer 22 that acts as an optical window.

Next, the fabrication process of the device of FIG. 5 will be described with reference to FIGS. 6A–6C. As will be noted, the device fabricated by the instant process is slightly different from the device of FIG. 5 in that the emitter electrode 24 is provided not on the lower major surface of the collector contact layer 21c but on the exposed upper major surface thereof.

Figure 6A:
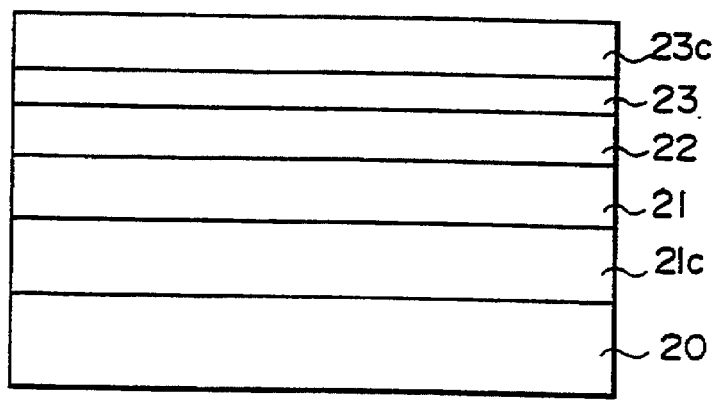
FIGS. 6A–6C are diagrams showing the fabrication process of the device of FIG. 5.

Referring to FIG. 6A, the collector contact layer 21c of n-type InGaAs is deposited on a semi-insulating substrate of InP by a MBE process, followed by a MBE deposition of the collector layer 21 of n-type InAlAs conducted upon the collector contact layer 21c. Further, the deposition of the base layer 22 of p-type InGaAs is made on the collector layer 21 by a MBE process, followed by a MBE deposition of the emitter layer 23 of n-type InAlAs further on the base layer 22, and a emitter contact layer 23c of n-type InGaAs is provided on the emitter layer 23 as indicated in FIG. 6A.

Figure 6B:
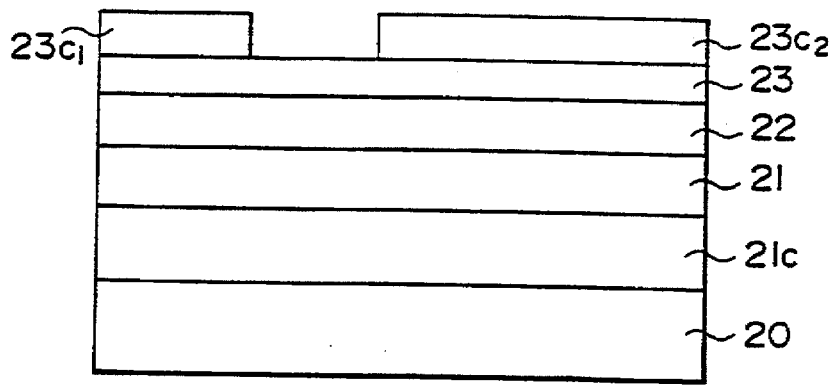

Next, in the step of FIG. 6B, a resist pattern (not shown) is provided on the emitter contact layer 23c so as to form an aperture exposing the surface of the layer 23c at a predetermined area, and a wet etching process is applied against the emitter contact layer 23c while protecting the surface of the layer 23 except for the part where the exposure aperture is formed. The etching process may be conducted by using a phosphoric acid as an etchant. As a result of the etching, an emitter mesa structure is formed, wherein the emitter mesa structure includes the emitter contact regions $23c_1$ and $23c_2$.

Figure 6C:
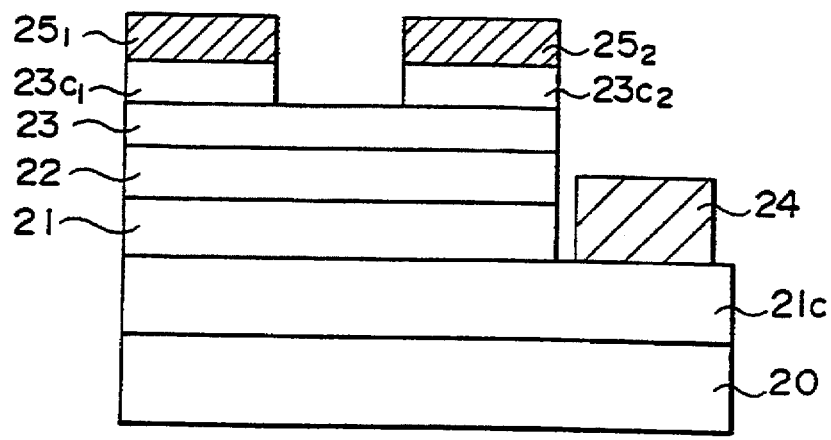

Next, as illustrated in FIG. 6C, a resist pattern is provided so as to cover the structure of FIG. 6C in correspondence to the part in which the bipolar transistor is to be formed, and the layers 23c through 21 are removed successively by applying a wet etching process of a phosphoric etchant, until the collector contact layer 21c is exposed. As a result, a collector mesa structure is formed as indicated in FIG. 6C in which it will be noted that the upper major surface of the collector contact layer 23c is exposed outside the device region. After the collector mesa is formed as such, the resist mask is removed and the emitter electrodes $25_1$ and $25_2$ are provided respectively on the emitter contact regions $23c_1$ and $23c_2$.

In the structure of FIG. 6C, it will be noted that the emitter layer 23 covers the entire surface of the base layer 22. As the emitter layer 23 has a bandgap substantially larger than the bandgap of the base layer 22, the photons produced as a result of the recombination of the carriers are effectively confined in the base layer 22 and the optical loss of the base layer 22 is substantially reduced.

It should be noted that the foregoing fabrication process of FIGS. 6A–6C is substantially the same as the fabrication process of a conventional multiple-emitter HBT. In other words, the light emitting device of the present invention can be fabricated easily by using the conventional facility for fabricating multiple-emitter HBTs.

In the HBT light emitting device of the structure of FIG. 5 or FIG. 6C, it should be noted that one can effectively suppress the unwanted rise of the collector current caused by impact ionization, by forming the collector region 21 with a wide gap material. Further, by forming both the collector layer 21 with a wide gap material in addition to the emitter layer 23, it is possible to confine the photons produced by the base layer 22 two-dimensionally. Thereby, the transmission loss of the optical beam through the base layer 22 is further reduced.

[Third Embodiment]

Figure 7:
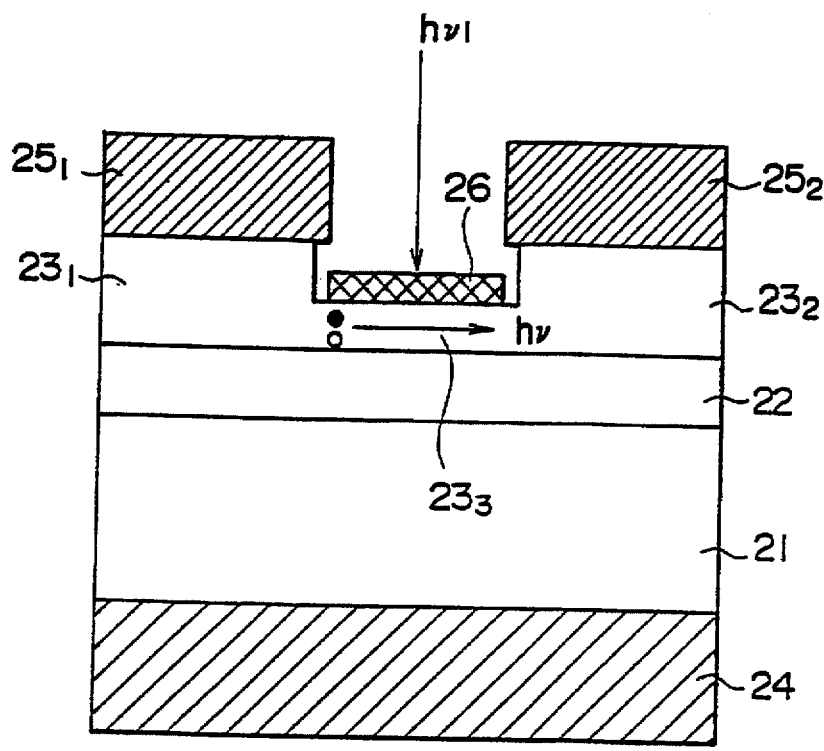
FIG. 7 is a diagram showing the construction of a photodetection device according to a third embodiment of the present invention in a cross sectional view.

FIG. 7 shows the construction of a light emitting device according to a third embodiment of the present invention. In FIG. 7, those parts corresponding to the parts described previously are designated by the same reference numerals and the description thereof will be omitted.

In the embodiment of FIG. 7, it should be noted that the bridging region $23_3$ of the emitter layer carries thereon a dummy base electrode 26. Thereby, the dummy base electrode 26 prevents any external optical radiation from penetrating into the channel layer 22, and any influence of the surrounding optical radiation upon the photon emission in the device is successfully eliminated. Further, by providing one or more of the electrodes $25_1$, $25_2$ and 26 with a material that is transparent to a selective wavelength as an optical window, it is possible to extract the optical radiation of the selected wavelength from such electrodes.

[Fourth Embodiment]

Figure 8:
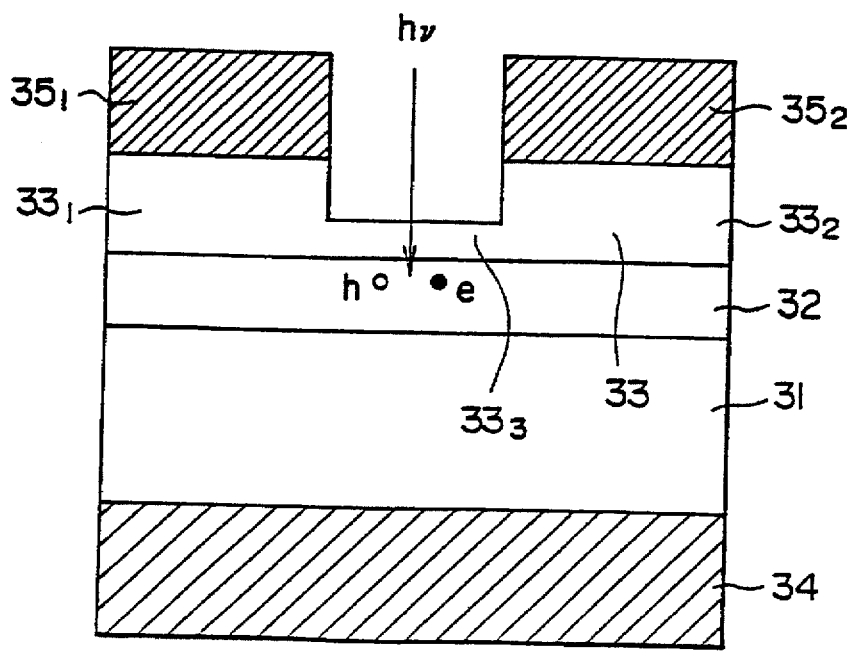
FIG. 8 is a diagram showing the construction of a photodetection device according to a fourth embodiment of the present invention in a cross sectional view.

FIG. 8 shows the construction of a photodetection device according to a fourth embodiment of the present invention.

Referring to FIG. 8, the photodetection device includes a collector layer 31 of n-type InGaAs having a thickness of 300 nm and an impurity concentration level of $3 \times 10^{16} cm^{-3}$, on which a p-type base layer 32 of InGaAs is provided. The base layer 32 may have a thickness of 80 nm and an impurity concentration level of $5 \times 10^{19} cm^{-3}$. Further, an emitter layer 33 of n-type InGaAs is provided further on the base layer 22 with an impurity concentration level of $3 \times 10^{18} cm^{-3}$, wherein the emitter layer 33 includes a first emitter region $33_1$ and a second emitter region $33_2$ both having a thickness of 200 nm. Further, a collector electrode 34 of Cr/Au is provided on the lower major surface of the collector layer 31 with a thickness of 20 nm for the Cu layer and a thickness of 300 nm for the Au layer. Similarly, first and second emitter electrodes $35_1$ and $35_2$ are provided respectively on the first and second emitter regions $33_1$ and $33_2$, wherein each of the emitter electrodes includes a stacking of a Cr layer having a thickness of 20 nm and a Au layer having a thickness of 300 nm.

It should be noted that the base layer 32 is covered entirely by the emitter layer 33 by forming a bridging region $33_3$ between the emitter regions $33_1$ and $33_2$. By doing so, the base layer 32 is protected from damage during the fabrication process of the device. Further, any surface degradation during the use of the device is effectively eliminated.

In operation, an optical beam is injected to the base layer 32 with an optical energy hv set so as to exceed a bandgap Eg of the base layer 32. In the illustrated example, the incident optical beam is injected via the bridging region $33_3$ connecting the first and second emitter regions $33_1$ and $33_2$. Thereby, the bridging region $33_3$ acts as an optical window. In response thereto, electron-hole pairs are excited in the base layer 32, and the electrons thus excited occupy the conduction band of the base layer 32 while the holes occupy the valence band. Thus, the electrons on the conduction band are removed quickly, while the holes in the valence band are not removed, and there occurs an accumulation of holes in the base layer 32.

With the accumulation of the holes in the base layer 32, on the other hand, the energy level of the base layer 32 shifts lower with respect to the emitter regions $33_1$ and $33_2$ for both the conduction band and the valence band, and the current starts to flow between the electrodes $35_1$ and $35_2$ when the level of the valence band of the base layer 22 coincides with the level of the valence band of the emitter regions $33_1$ and $33_2$. In this case, both the electrons and holes contribute to the current flowing between the electrodes $35_1$ and $35_2$.

Thus, by detecting the current between the emitter electrodes $35_1$ and $35_2$, it is possible to detect the optical radiation incident to the device of FIG. 8. When operating the photodetection device according to the operational mode as set forth above, the collector layer 31 is held at a low potential level such that there is no substantial flow of electrons from the base layer 32 to the collector layer 31. By applying a bias voltage between the electrodes $35_1$ and $35_2$ such that the bias voltage does not exceed a predetermined threshold, it is possible to achieve a sharp rise of the output current in response to the optical radiation.

Alternatively, the device of the present may be operated by applying a bias voltage across one of the emitter electrodes such as the electrode $35_1$ and the collector electrode 34. The bias voltage is set to have a magnitude such that no substantial current flows from the emitter electrode $35_1$ to the collector electrode 34. In response to the radiation of the optical beam upon the base layer 32 as indicated in FIG. 8, the electrons and holes are excited similarly as before, and the electrons thus excited are caused to flow to the collector layer 31 by the electric field created by the collector bias voltage. On the other hand, the holes remain in the base layer 32 because of the same reason as before, and there occurs an accumulation of the holes.

In the device of FIG. 8, it is possible to neutralize or annihilate such holes in the base layer 32 by injecting electrons thereinto from the other emitter electrode $35_2$ via the second emitter region $33_2$ such that the electrons thus injected cause a recombination with the holes accumulated in the base layer 32. By doing so, the original operational state of the device is recovered immediately and the device is ready for detecting a subsequent optical pulse. In other words, the photodetection of the device of FIG. 8 shows an excellent response under such a biasing scheme. As there occurs a substantial current amplification in the device that has the structure of a bipolar transistor, the device shows a very large sensitivity due to the current amplification achieved inherently by the device.

[Fifth Embodiment]

Figure 9:
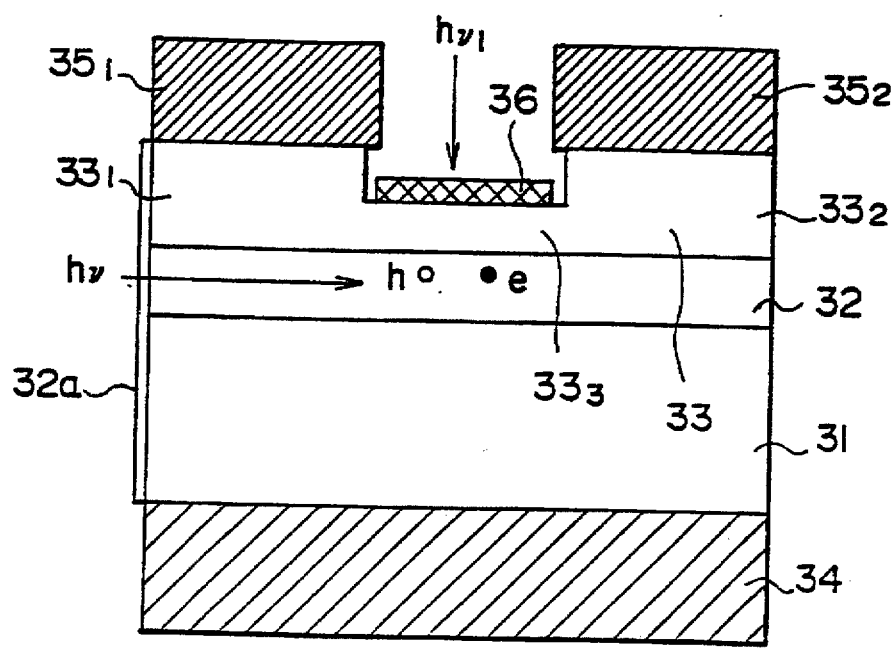
FIG. 9 is a diagram showing the construction of a photodetection device according to a fifth embodiment of the present invention in a cross sectional view.

FIG. 9 shows the construction of a photodetection device according to a fifth embodiment of the present invention. In FIG. 9, those parts described previously with reference to FIG. 8 will be designated by the same reference numeral and the description thereof will be omitted.

In the embodiment of FIG. 9, a dummy base electrode 36 is provided so as to cover the bridging region $33_3$ of the emitter layer 33. Thereby, the device of FIG. 9 receives the incident optical beam that impinges into the base layer 32 from an edge surface thereof as indicated in FIG. 9 by hv. On the other hand, the optical beam or light incident vertically to the device as indicated in FIG. 9 by $hv_1$ is effectively interrupted. In other words, the cross-talk of the optical beam $hv_1$ to the optical signals in the optical beam hv is effectively eliminated. Further, in the device of FIG. 9, the response speed of the device is improved further by supplying a current from the dummy base electrode 36 with a magnitude below a predetermined threshold. Of course, any opaque cover or film including insulators may be used for the dummy base electrode 36, as long as the opaque cover is not used for an electrode.

As will be described later, one can construct a masked ROM by arranging the device of FIG. 9 in rows and columns, with the dummy base electrode 36 provided only on selected devices in accordance with the information to be stored in the ROM. Thereby, a large number of such masked ROMs are assembled together to form a memory device such that each masked ROM carries a mask pattern pertinent thereto. By selectively hitting one of the masked ROMs in the memory device with an optical beam, it is possible to read out the information stored in the selected masked ROM.

In the device of FIG. 9, one may provide an anti-reflection film 32a to cover the edge surface of the base layer 32.

[Sixth Embodiment]

Figure 10:
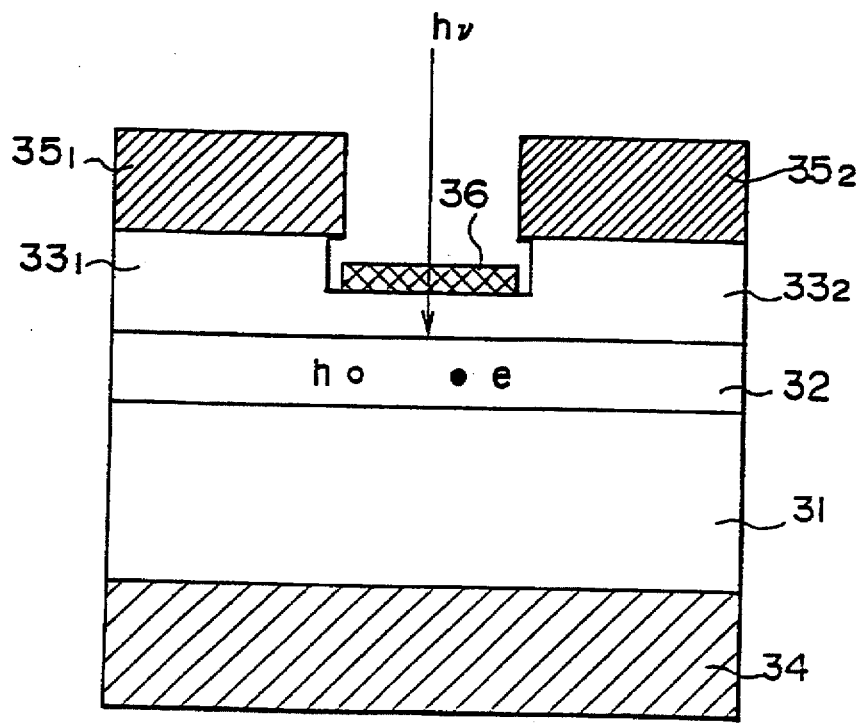
FIG. 10 is a diagram showing the construction of a photodetection device according to a sixth embodiment of the present invention in a cross sectional view.

FIG. 10 shows the construction of a photodetection device according to a sixth embodiment of the present invention. In FIG. 6, those parts described previously are designated by the same reference numerals and the description thereof will be omitted.

Referring to FIG. 10, the device has a structure similar to that of the device of FIG. 9 in that both devices include the dummy base electrode 36. In the device of FIG. 10, the dummy base electrode 36 is actually formed of an optical filter such as a semiconductor or dielectric multilayer filter that has an optical passband coincident to the wavelength of the incident optical beam hv. Thus, the device of FIG. 10 is used to modulate the collector current selectively in response to the optical input supplied with a wavelength that matches the optical passband of the filter 36. Further, one may provide an anti-reflection film in place of the filter 36.

Similarly to the embodiment of FIG. 9, the device of FIG. 10 can be used to construct a masked ROM by arranging the device of FIG. 10 in rows and columns, with the dummy base electrode 36 provided only on selected devices in accordance with the information to be stored in the ROM. Thereby, a large number of such masked ROMs may be assembled together to form a memory device such that each masked ROM carries a mask pattern pertinent thereto. By selectively hitting one of the masked ROMs in the memory device with an optical beam, it is possible to read out the information stored in the selected masked ROM.

[Seventh Embodiment]

Figure 11:
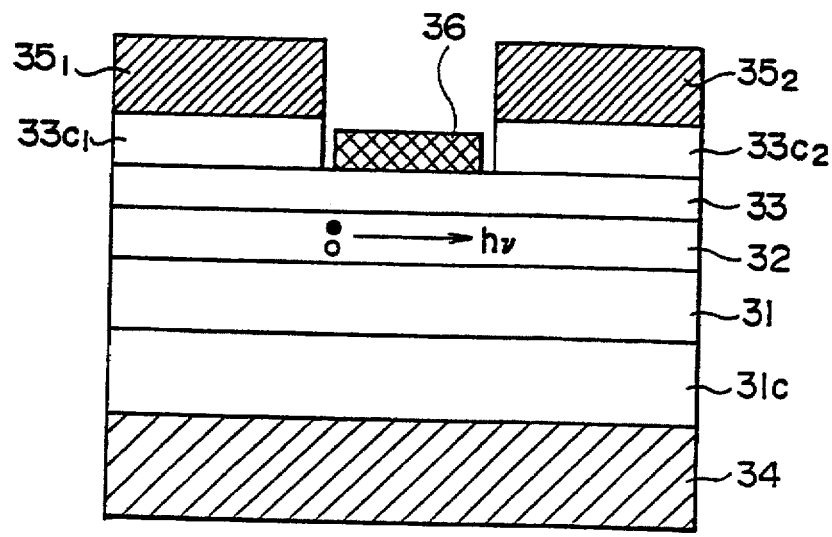
FIG. 11 is a diagram showing the construction of a photodetection device according to a seventh embodiment of the present invention in a cross sectional view.

FIG. 11 shows a photodetection device according to a seventh embodiment of the present invention. In FIG. 11, those parts corresponding to the parts described previously are designated by the same reference numerals and the description thereof will be omitted.

In the present embodiment, the device has a structure similar to that of the device of FIG. 9 except that a collector contact layer 31c of n-type InGaAs is provided with a thickness of 300 nm and an impurity concentration level of $5\times10^{18} cm^{-3}$, and the collector layer 31 is provided on the collector contact layer 31c formed as such, wherein the collector layer 31 has a composition of InGaAs and is doped to the n-type with an impurity concentration level of $1\times10^{17} cm^{-3}$. The collector layer 31 is provided with a thickness of 300 nm. On the collector layer 31, the base layer 32 is provided with the composition of InGaAs doped to the p-type similarly to the device of FIG. 9, with a thickness of 70 nm and with an impurity concentration level of $5\times10^{19} cm^{-3}$. Further, the emitter layer 33 is provided on the base layer with a composition of InAlAs, wherein the emitter layer 33 has a thickness of 200 nm and is doped to the n-type with an impurity concentration level of $3\times10^{18} cm^{-3}$.

On the emitter layer 33, it is noted that the first and second emitter contact regions $33c_1$ and $33c_2$ are provided with a thickness of 200 nm, wherein each of the regions $33c_1$ and $33c_2$ is doped to an impurity concentration level of $5\times10^{19} cm^{-3}$. Further, the emitter contact regions $33c_1$ and $33c_2$ carry thereon the emitter electrodes $35_1$ and $35_2$ respectively, and the collector contact layer $31c$ carries the collector electrode 34 on the lower major surface thereof similarly as before, wherein the collector electrode 34 is formed of a stacking of a Cr layer having a thickness of 20 nm and an Au layer having a thickness of 300 nm.

In the device of FIG. 11, it should be noted that the emitter electrodes $35_1$ and $35_2$ are formed of a conductive material that is transparent to a selected wavelength of the optical radiation. For example, the emitter electrodes $35_1$ and $35_2$ may be formed of a material such as $InSnO$ or $NdIn_2O_4$ that has a spinel structure. By using such transparent electrodes, it is possible to inject optical radiation via the emitter electrodes $35_1$ and $35_2$. Particularly, the latter material having the composition of $NdIn_2O_4$ is suitable for the present purpose, as the material has a broad optical passband ranging from near infrared to visible wavelengths and simultaneously shows an excellent conductivity in the order of $10^4 S/cm$.

[Eighth Embodiment]

Figure 12:
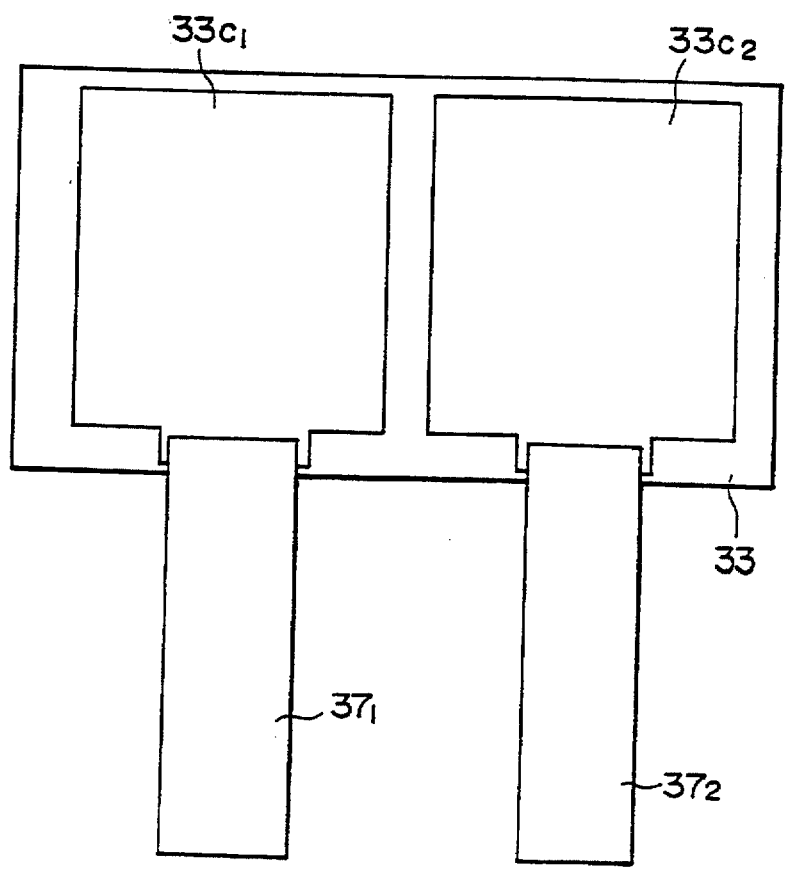
FIG. 12 is a diagram showing the construction of a photodetection device according to an eighth embodiment of the present invention in a plan view.

FIG. 12 shows the photodetection device according to an eighth embodiment of the present invention in a plan view.

Referring to FIG. 12, the device has a structure similar to that of FIG. 11 except that the emitter electrodes $35_1$ and $35_2$ are eliminated and the emitter contact regions $33c_1$ and $33c_2$ are exposed. In place of the emitter electrodes $35_1$ and $35_2$, the device of FIG. 12 uses emitter leads $37_1$ and $37_2$ such that the emitter leads $37_1$ and $37_2$ are connected to marginal regions of the emitter contact regions $33c_1$ and $33c_2$, respectively. By eliminating the emitter electrodes $35_1$ and $35_2$, the device of FIG. 12 minimizes any optical loss of the optical beam incident to the emitter contact regions $33c_1$ and $33c_2$. In the device of FIG. 12, the impurity concentration level of the emitter contact regions $33c_1$ and $33c_2$ is increased for reducing the resistance thereof.

[Ninth Embodiment]

Figure 13:
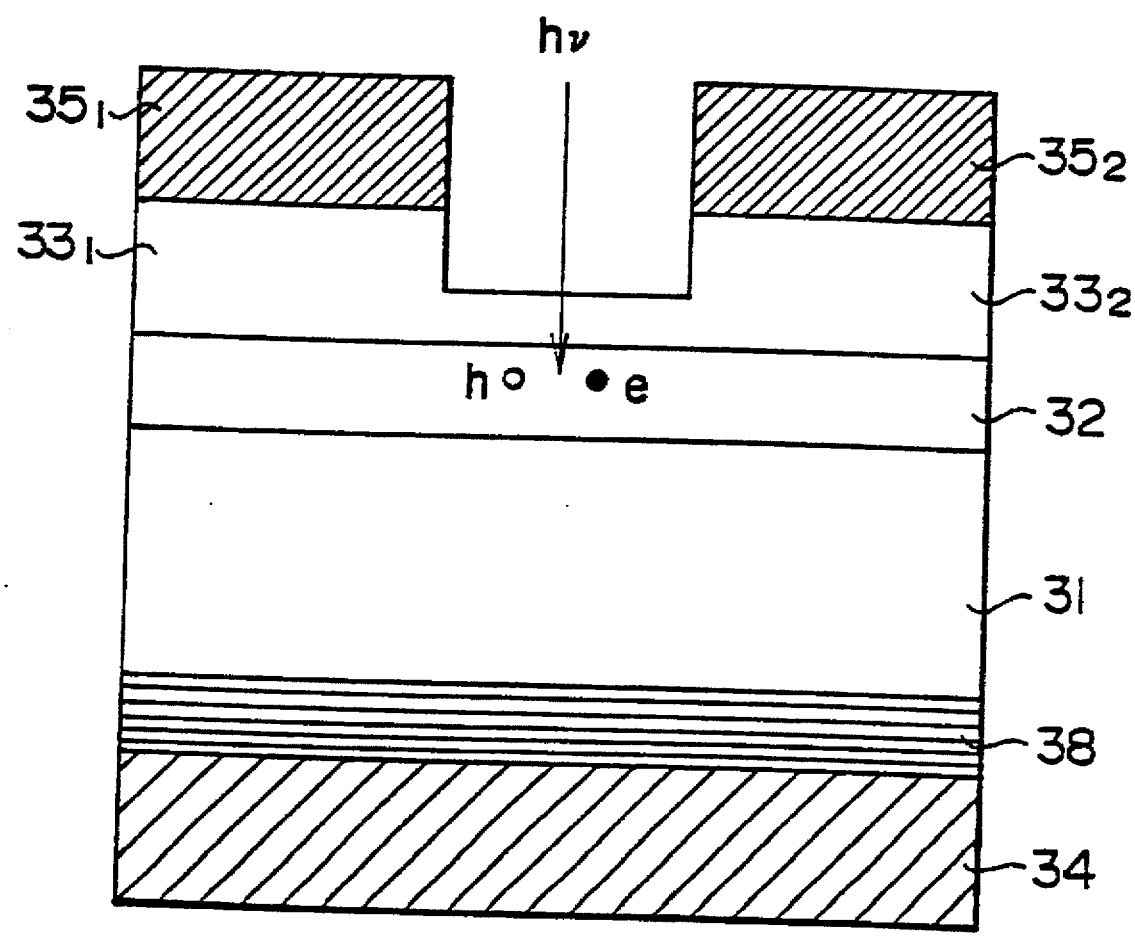
FIG. 13 is a diagram showing the construction of a photodetection device according to a ninth embodiment of the present invention in a cross sectional view.

FIG. 13 shows a photodetection device according to a ninth embodiment of the present invention. In FIG. 13, those parts corresponding to the parts described previously are designated by the same reference numerals and the description thereof will be omitted.

In the device of FIG. 13, a Fabry-Pérot resonator 38 is provided on the lower major surface of the collector layer 31, and the collector electrode 34 is provided on the lower major surface of the Fabry-Pérot resonator 38 thus formed. The Fabry-Pérot resonator is formed of an alternating stacking of an InAlAs film and an InGaAlAs film repeated eight times, wherein each of the InAlAs and InGaAlAs films has a thickness corresponding to a quarter wavelength of the optical beam to be detected.

By employing such a Fabry-Pérot resonator 38, it is possible induce a resonance in the incident optical beam with an optical beam reflected by the Fabry-Pérot resonator 38, such that the anti-node of resonance is formed coincident to the base layer 32 or the collector layer 31. Thereby, the efficiency of photoelectric conversion is substantially improved.

[Tenth Embodiment]

Next, the photodetection device according to a tenth embodiment of the present invention will be described with reference to FIGS. 14A–14E showing a band diagram of the device. In the drawings, the vertical axis represents the energy level as usual in a band diagram. As the device of the present embodiment has a structure of any of the previously described devices, further description about the structural feature of the device will be omitted. In the description hereinafter, the emitter region $33_1$ or the emitter contact region $33c_1$ is designated as a first emitter region $E_1$, the emitter region $33_2$ or the emitter contact region $33c_2$ is designated as a second emitter region $E_2$, the base layer 32 is designated as a base region B, and the collector layer 31 is designated as a collector region C.

Figure 14A:
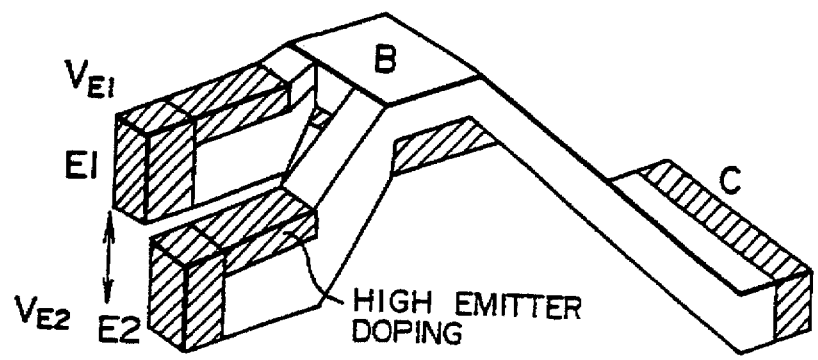
FIGS. 14A–14E are band diagrams showing the operational principle of the photodetection device according to a tenth embodiment of the present invention.

Referring to FIG. 14A, it will be noted that the first emitter region $E_1$ and the second emitter region E are biased to respective positive bias voltages $V_{E1}$ and $V_{E2}$, wherein the voltage $V_{E1}$ is set substantially higher than the voltage $V_{E2}$ in the state of FIG. 14A ($0<V_{E1}<<V_{E2}$). It should be noted that no optical radiation is applied to the device in the state of FIG. 14A. As there occurs no creation of electrons e and holes h in the base layer B in the absence of the optical radiation, no collector current flows through the device.

Figure 14B:
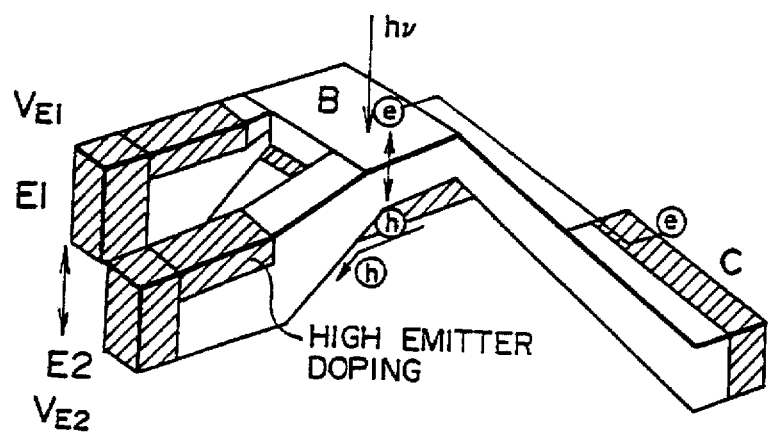
Figure 14C:
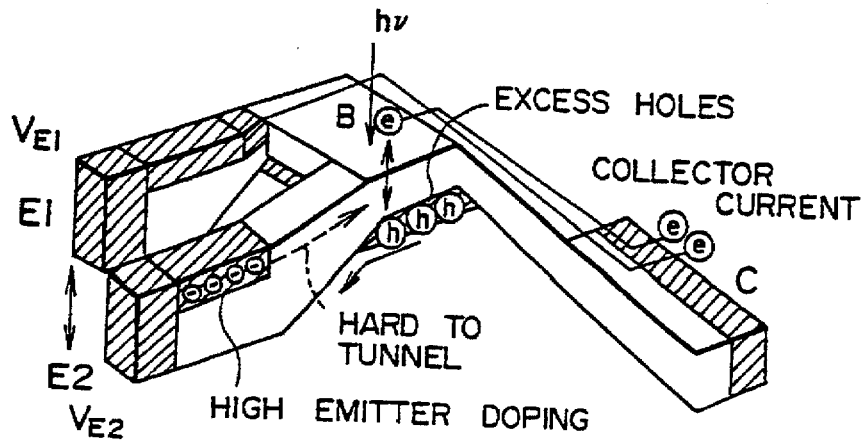

In the state of FIG. 14B, on the other hand, an optical radiation hv is applied to the base layer B while maintaining the device in the same biasing state as in the case of FIG. 14A. Thereby, electrons e and holes h are created in the base region B as a result of optical excitation, and the electrons thus created immediately escape to the collector region C along the potential slope of the conduction band. In other words, there flows a collector current Ic. On the other hand, the holes dwell in the base region B that forms a potential well against holes, and there occurs an accumulation of the holes in the base region B as a result.

Figure 14D:
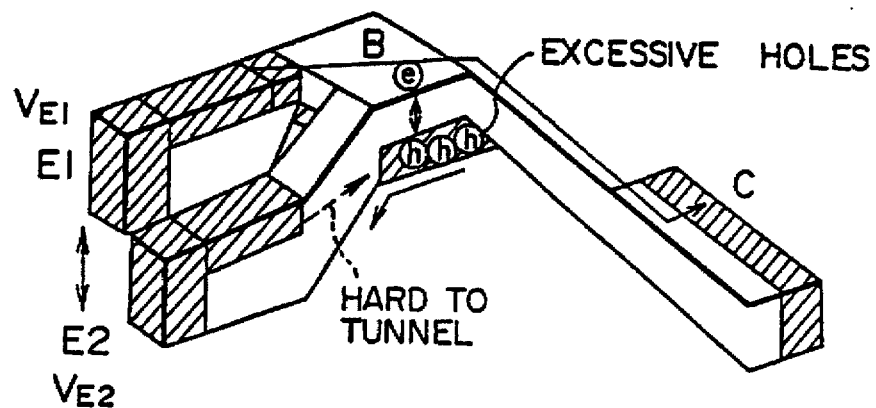

With further continuation of the optical beam radiation, the accumulation of the holes in the base region B continues, and the energy level of the base region B shifts lower as a result of such hole accumulation. Such a lowering of the energy level of the base region B, in turn, allows the electrons in the first emitter region $E_1$ to flow into the base region B as indicated in FIG. 14D and further into the collector region C, and the collector current Ic flows in response to the flow of the electrons.

Figure 14E:
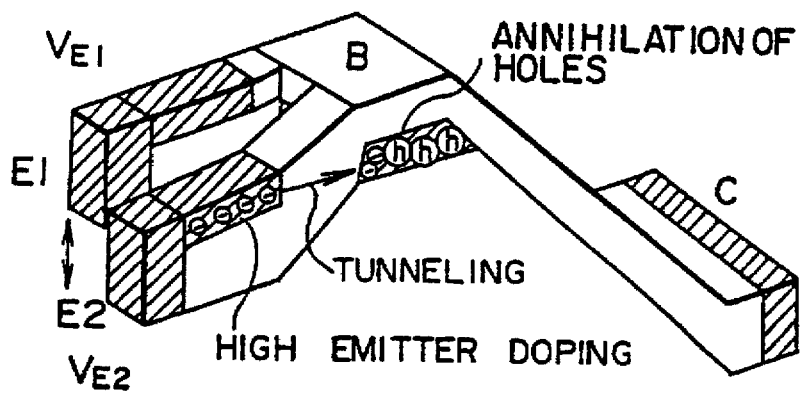

FIG. 14E shows the state in which the optical radiation is interrupted and the voltage $V_{E2}$ of the emitter region $E_2$ is slightly lowered to a level still higher than the voltage $V_{E1}$ of the emitter region $E_1$ ($0<V_{E1}<E_2$). In this state, the electrons are injected from the second emitter region $E_2$ into the base region B to cause an annihilation of holes accumulated therein. Upon annihilation of the holes in the base region B, the energy level of the base region B increases again to the initial state of FIG. 14A. In response to this, the injection of the electrons from the emitter region $E_1$ to the base region B is effectively interrupted, and hence the collector current Ic.

In order to facilitate such an injection of the electrons from the emitter region $E_2$ to the base region B, the device of the present invention has a construction such that the base region B and the emitter regions $E_1$ and $E_2$ are doped with respective impurity concentration levels such that the impurity concentration level of the base region B exceeds the effective density of state of the semiconductor material forming the base region B and such that the impurity concentration level of the emitter regions $E_1$ and $E_2$ exceeds the effective density of state of the semiconductor material forming the emitter regions. Thereby, the p-n junction between the base region B and the emitter region $E_2$ easily causes a breakdown and the electrons are injected efficiently from the emitter region $E_2$ to the base region B by causing a tunneling through the depletion region associated with the p-n junction. By externally injecting the electrons to the base region B, one can reduce the recovery time of the device and the photodetection device shows an excellent response against high speed optical input.

[Eleventh Embodiment]

A similar operational principle described with reference to the tenth embodiment of the present invention for improved response, is applicable also to a photodetection device having the structure of a single-emitter HBT, by doping the emitter region and the base region to the impurity concentration levels exceeding the respective effective density of states.

Figure 15A:
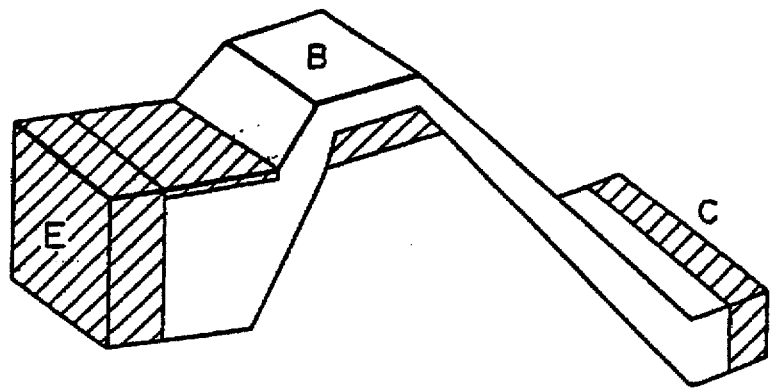
FIGS. 15A–15C are band diagrams showing the operation of a conventional photodiode.
Figure 15B:
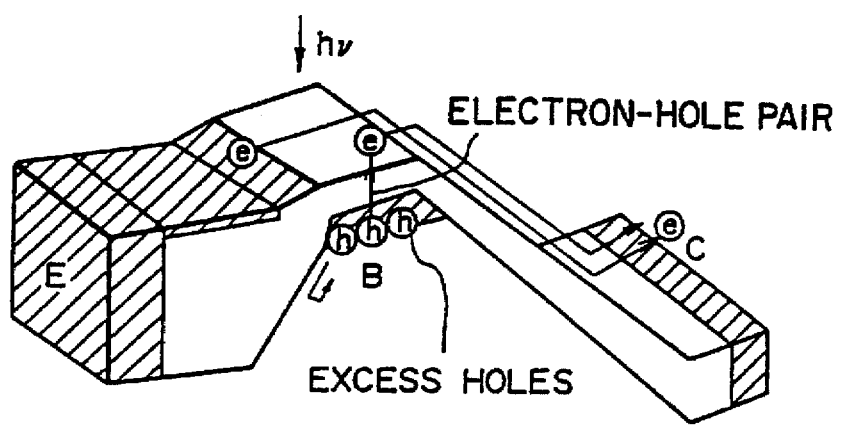
Figure 15C:
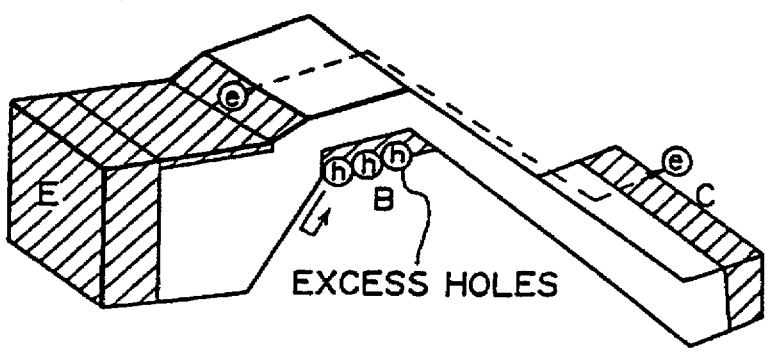

FIGS. 15A–15C show the operation of a conventional HBT when used for a photodetection device, wherein FIGS. 15A–15C show the band structure of the device similarly to the band diagrams of FIGS. 14A–14E. In the drawings, the emitter layer of the device is represented by an emitter region E, the base layer by a base region B, and the collector layer by a collector region C.

Referring to FIG. 15A, the device is biased such that a negative voltage is applied to the emitter region E and a positive voltage to the collector region C. On the other hand, no optical radiation is applied to the base region B. In this state where the base region B forms a potential barrier, no excitation of electrons and holes occurs, and no collector current Ic appears.

In the state of FIG. 15B, on the other hand, an optical radiation is applied to the base region B while holding the voltage level of the emitter region E and the collector region C similarly as in the case of FIG. 15A. In this state, there occurs a creation of electrons and holes in the base region B, while the electrons thus created escape immediately to the collector region C along the slope of the conduction band, leaving the holes in the base region B. As a result of such an accumulation of the holes, the energy level of the base region B decreases with respect to the emitter region E, and the injection of electrons from the conduction band of the emitter region E to the conduction band of the base region B starts. The electrons thus injected immediately escape to the collector region C by drifting along the sloped conduction band between the base region B and the emitter region C, and a collector current Ic starts to flow.

FIG. 15C shows the state in which the irradiation of the optical beam is interrupted in the state of FIG. 15B. In the state of FIG. 15C, it will be noted that the accumulation of the holes in the base region B remains and hence the collector current Ic keeps on flowing. Until the holes in the base region B are dissipated, the device does not recover the original state of FIG. 15A. In other words, the conventional photodetection devices having the structure of a bipolar transistor have suffered from the problem of slow response.

In the present embodiment, the foregoing problem of slow recovery of the initial state of the device is successfully eliminated by increasing the impurity concentration level in the emitter region E and the base region B such that impurity concentration level exceeds the effective density of state in each of the emitter region E and the base region B. By increasing the impurity concentration level in the emitter and base regions of a bipolar transistor, it is possible to reduce the thickness of the depletion region formed at the p-n junction between the base region B and the emitter region E.

Figure 16A:
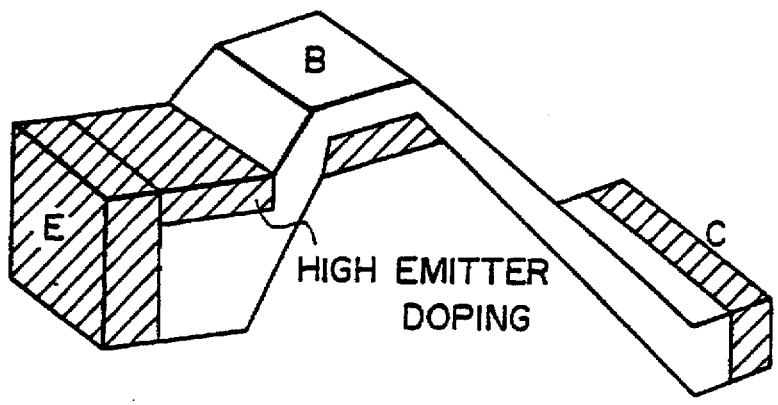
FIGS. 16A–16C are band diagrams showing the operation of a photodiode according to an eleventh embodiment of the present invention.
Figure 16B:
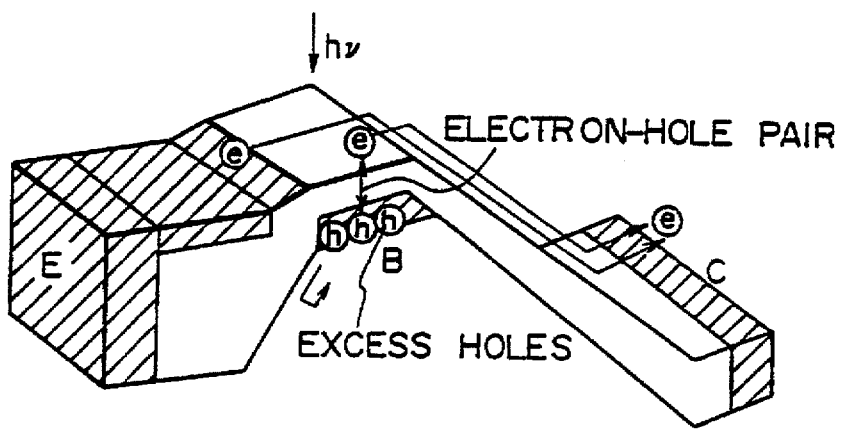

Thus, upon irradiation of the optical beam on the base region B, the energy level of the conduction band and the valence band of the base region B decreases as indicated in FIG. 16B, and the electrons in the emitter region start to flow from the emitter region E to the collector region C via the base region B, along the conduction band similarly as in the case of FIG. 15B. Thereby, a collector current Ic flows from the collector C to the emitter E.

Figure 16C:
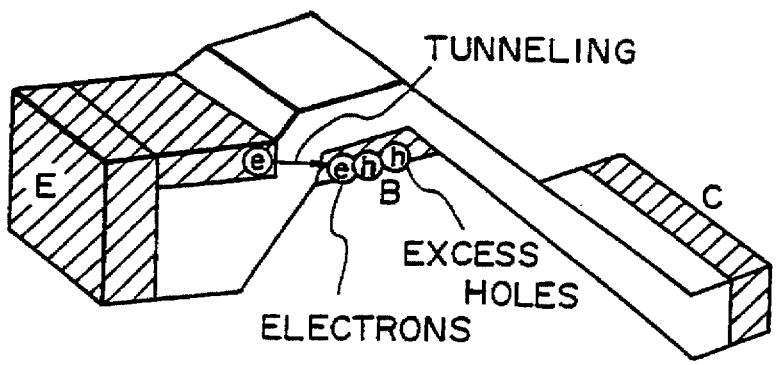

In the step of FIG. 16C where the irradiation of the optical beam is interrupted, it should be noted that the electrons on the conduction band of the highly doped emitter region E cause a tunneling to the valence band of the base region B through the depletion layer formed at the emitter-base junction, because of the reduced depletion layer thickness. Thereby, the holes accumulated in the base region B are quickly neutralized, and the device resumes the initial band structure of FIG. 16A.

[Twelfth Embodiment]

Figure 17:
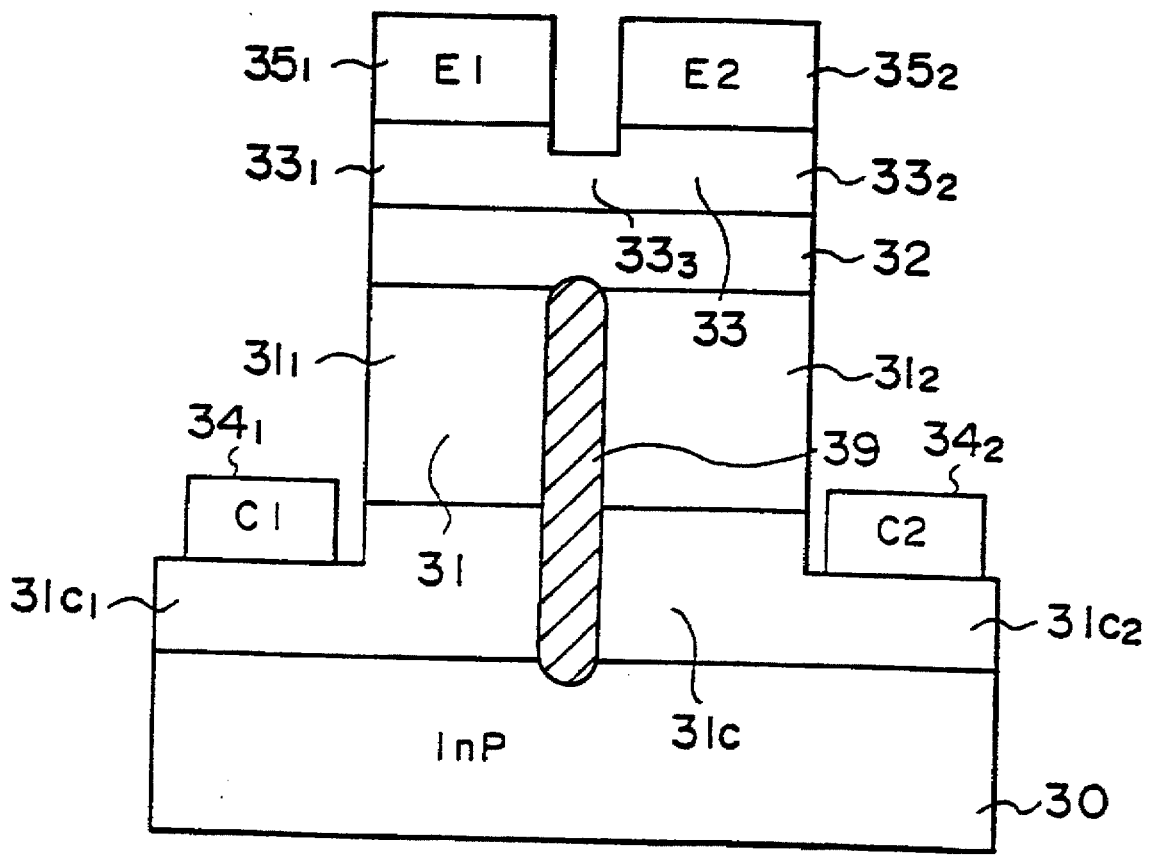
FIG. 17 is a diagram showing the construction twelfth embodiment of the present invention in a cross of a semiconductor optical switch according to a sectional view.

FIG. 17 shows the construction of a semiconductor optical switch according to a twelfth embodiment of the present invention. In FIG. 17, those parts corresponding to the parts described previously are designated by the same reference numerals and the description thereof will be omitted.

Referring to FIG. 17, the optical switch has a structure similar to that of FIG. 8 except that the device includes the collector contact layer 31c underneath the collector layer 31, wherein the collector contact layer 31c is provided upon a semi-insulating substrate 30 of InP.

In the device of FIG. 17, it should be noted that an inactive region 39 is formed in the collector layer 31 as well as in the collector contact layer 31c underneath thereof by an ion implantation process, such that the inactive region 39 extends from the collector contact layer 31c up to the collector layer 31. Thereby, the collector layer 31 is laterally divided into a first collector region $31_1$ and a second collector region $31_2$ by the inactive region 39. Similarly, the collector contact layer 31c is divided into a first region $31c_1$ and a second region $31c_2$. It should be noted that the inactive region 39 does not penetrate into the base layer 32. Further, in correspondence to the first and second collector regions $31c_1$ and $31c_2$, there are provided first and second collector electrodes $34_1$ and $34_2$.

It should be noted that the device of FIG. 17 may employ a heterojunction of the InGaAs/InAlGaAs system for the base-emitter junction. In this case, the base layer 32 is formed of InGaAs doped to the p-type, while the emitter layer 33 is formed of n-type InAlGaAs. Further, the collector layer 31 is formed of n-type InGaAs, not of InAlGaAs. The doping of such a InGaAs/InAlGaAs system is preferably conducted by using Be or C for the p-type dopant.

In operation, electrons and holes are injected to the base layer 32 from the emitter electrodes $35_1$ and $35_2$, such that photon emission in the base layer 32 occurs as a result of recombination. The optical radiation thus produced reaches the collector regions $31_1$ and $31_2$ in the collector layer 32, and induces a modulation of the collector current flowing between the foregoing first and second collector electrodes $34_1$ and $34_2$. In other words, one can switch the collector current in response to the optical radiation induced in the base layer 32.

[Thirteenth Embodiment]

Next, a semiconductor optical switch according to a thirteenth embodiment of the present invention will be described with reference to FIG. 18.

Figure 18:
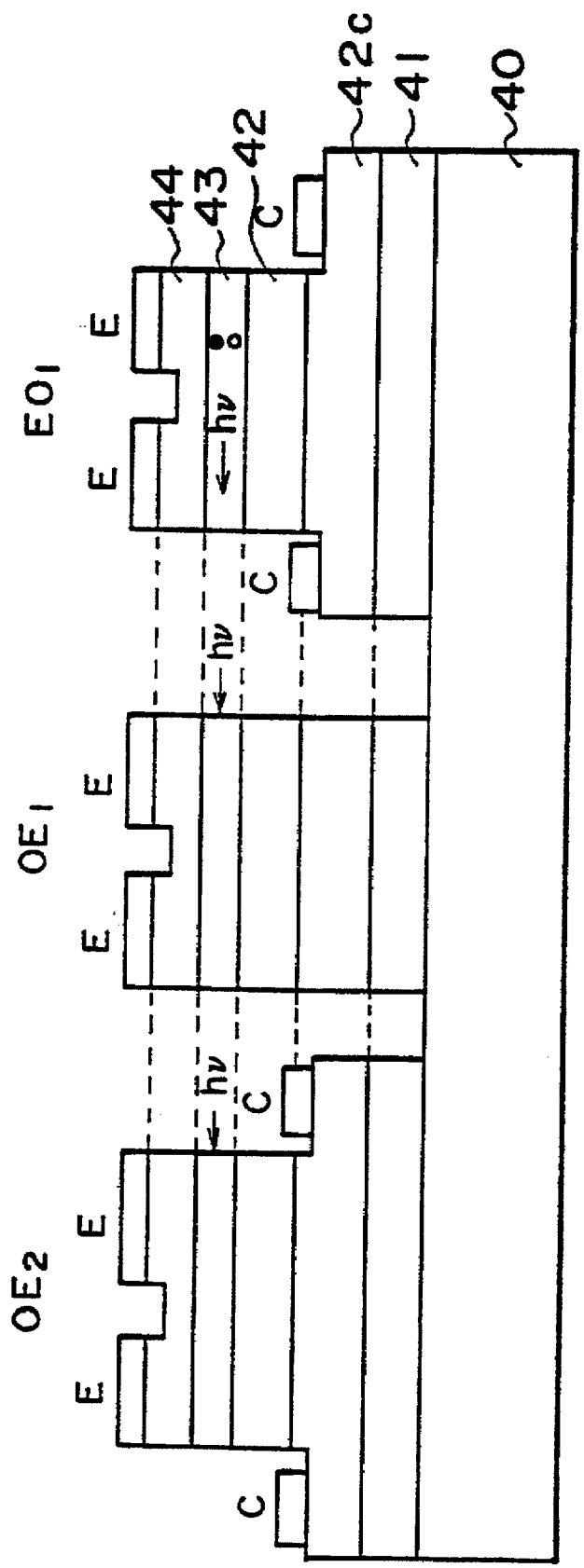
FIG. 18 is a diagram showing the construction of a semiconductor optical switch according to a thirteenth embodiment of the present invention in a cross sectional view.

Referring to FIG. 18, the semiconductor optical switch is constructed upon a substrate of semi-insulating InP and includes a buffer layer 41 of n-type InGaAs, a collector contact layer 42c of n-type InGaAs, a collector layer 42 of n-type InAlAs, a base layer 43 of p-type InGaAs, and an emitter layer 44 of n-type InAlAs, wherein the layers 41–44 are deposited consecutively on the substrate 40 by an epitaxial process.

After the layered structure of FIG. 18 is formed, an anisotropic etching process is applied to form mesa structures $OE_1$, $OE_2$ and $EO_1$ commonly on the substrate 40, such that the mesa structures are isolated from each other by an isolation trench reaching the surface of the substrate. Each of the mesa structures $OE_1$, $OE_2$ and $EO_1$ has a structure similar to the multiple emitter device described previously and includes a pair of emitter electrodes E. On the other hand, no base electrode is provided. Further, the mesa structures $OE_1$ and $OE_2$ includes a collector electrode C in contact with the collector contact layer 42c. Thereby, a light emitting device is formed in correspondence to the mesa structure $EO_1$, and photodetection devices are formed in correspondence to the mesa structures $OE_1$ and $OE_2$. It should be noted that the light emitting device $EO_1$ may have the structure of any of the first through third embodiments. On the other hand, the photodetection devices $OE_1$ and $OE_2$ may have the structure of any of the fourth through tenth embodiments.

In operation, the photodetection device $OE_1$ is operated so as to detect the incident optical beam by detecting the change of the current flowing from the first emitter electrode to the second emitter electrode. On the other hand, the photodetection device is operated so as to detect the incident optical beam by detecting the change of the current flowing from the collector electrode to one of the emitter electrodes. In any of these photodetection devices $OE_1$ and $OE_2$, there occurs an optical emission in the light emitting device $EO_1$ and the photodetection devices $OE_1$ and $OE_2$ cause a switching in response thereto. It should be noted that the base layer is provided at the common level or height in each of the devices $OE_1$, $OE_2$ and $EO_1$. Thus, one can achieve an inherent optical alignment between these devices, and the optical beam produced by the light emitting device $EO_1$ is received by the photodetection device $OE_1$ and $OE_2$ with reliability, without conducting any complex optical alignment process.

[Fourteenth Embodiment]

Figure 19:
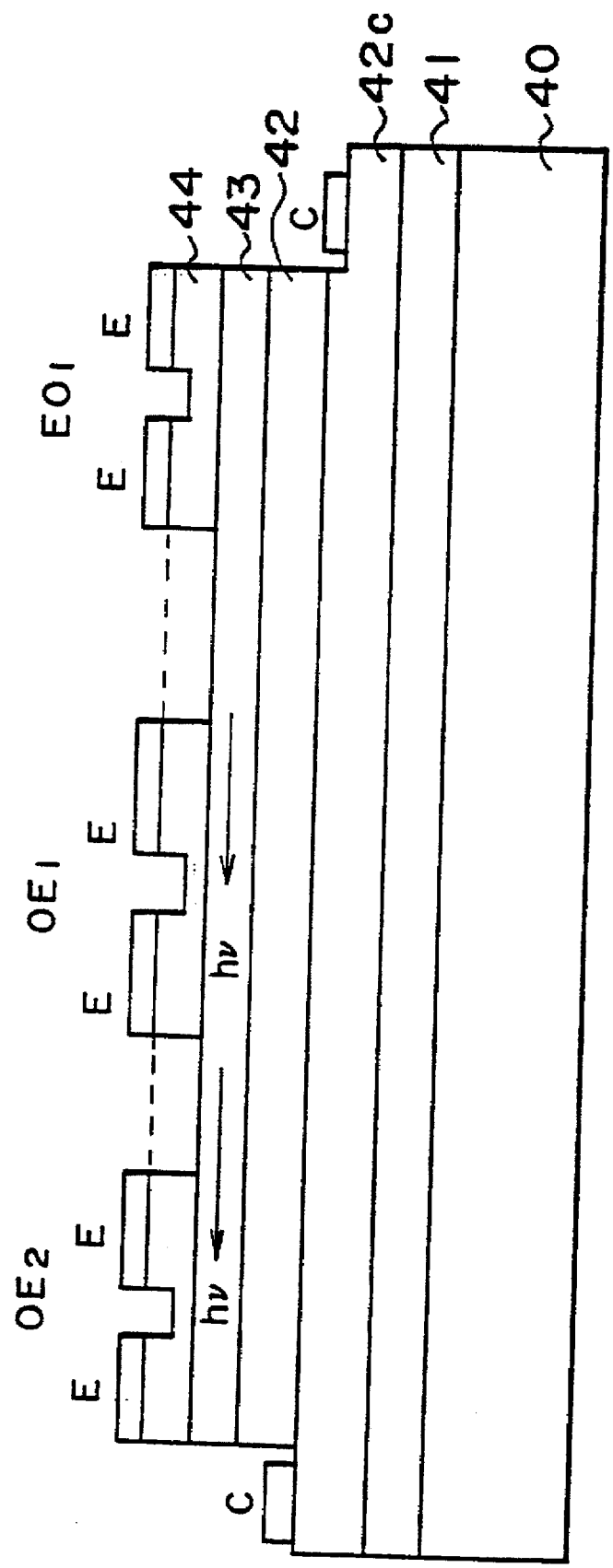
FIG. 19 is a diagram showing the construction of an optical semiconductor integrated circuit according to a fourteenth embodiment of the present invention in a cross sectional view.

FIG. 19 shows the construction of a semiconductor optical integrated circuit according to a fourteenth embodiment of the present invention. In FIG. 19, those parts corresponding to the parts described previously are designated by the same reference numerals and the description thereof will be omitted.

In the present embodiment, the emitter layer 44 alone is subjected to an etching process to expose the upper major surface of the base layer 43, such that the devices $OE_1$, $OE_2$ and $EO_1$ are formed as emitter structures that are isolated from each other on the base layer 43.

In the present embodiment, the optical radiation produced by the light emitting device $EO_1$ in the base layer 43 is guided along the base layer 43 and reaches the photodetection devices $OE_1$ and $OE_2$, thereby causing a switching of a collector current therein. Preferably, the emitter layer 44 and the collector layer 42 are formed of an n-type wide gap material such as InAlAs, such that an efficient optical confinement occurs in the base layer 43. Further, one can minimize the optical loss by eliminating the edge surface in the devices $OE_1$, $OE_2$ and $EO_1$. It should be noted that such an edge surface acts as a half transparent mirror and reflects a part of the optical beam incident to the device.

[Fifteenth Embodiment]

Figure 20:
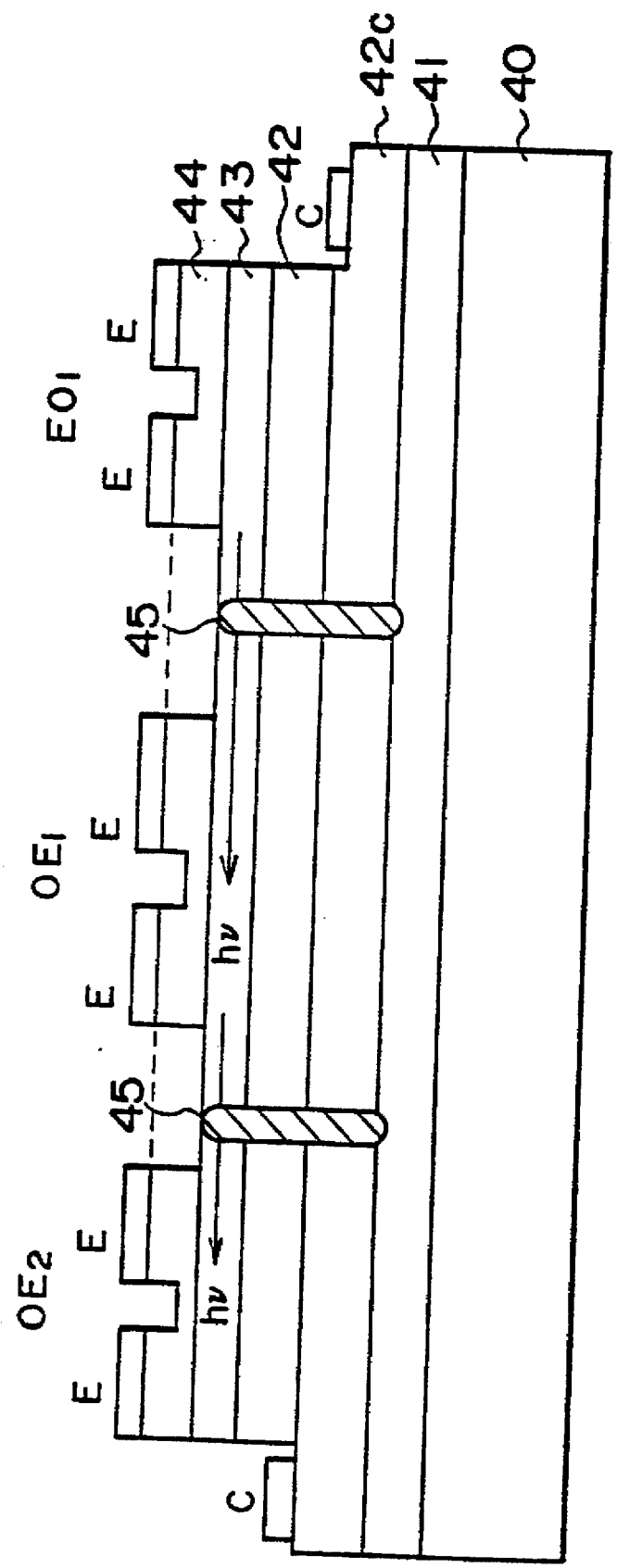
FIG. 20 is a diagram showing the construction of an optical semiconductor integrated circuit according to a fifteenth embodiment of the present invention.

FIG. 20 shows the construction of a semiconductor optical integrated circuit according to a fifteenth embodiment of the present invention. In FIG. 20, those parts described previously with reference to previous embodiments are designated by the same reference numerals and the description thereof will be omitted.

In the present embodiment, it is noted that the device has a structure similar to that of FIG. 19 except that there are formed isolation regions 45 between the devices $OE_1$, $OE_2$ and $EO_1$ by an ion implantation process of a deep impurity element such as oxygen, such that the isolation region 45 extends from the collector contact layer 42c to the base layer 43. By providing the isolation regions 45 as such, it is possible to minimize the interference in the operation of the devices $OE_1$, $OE_2$ and $EO_1$.

[Sixteenth Embodiment]

Figure 21:
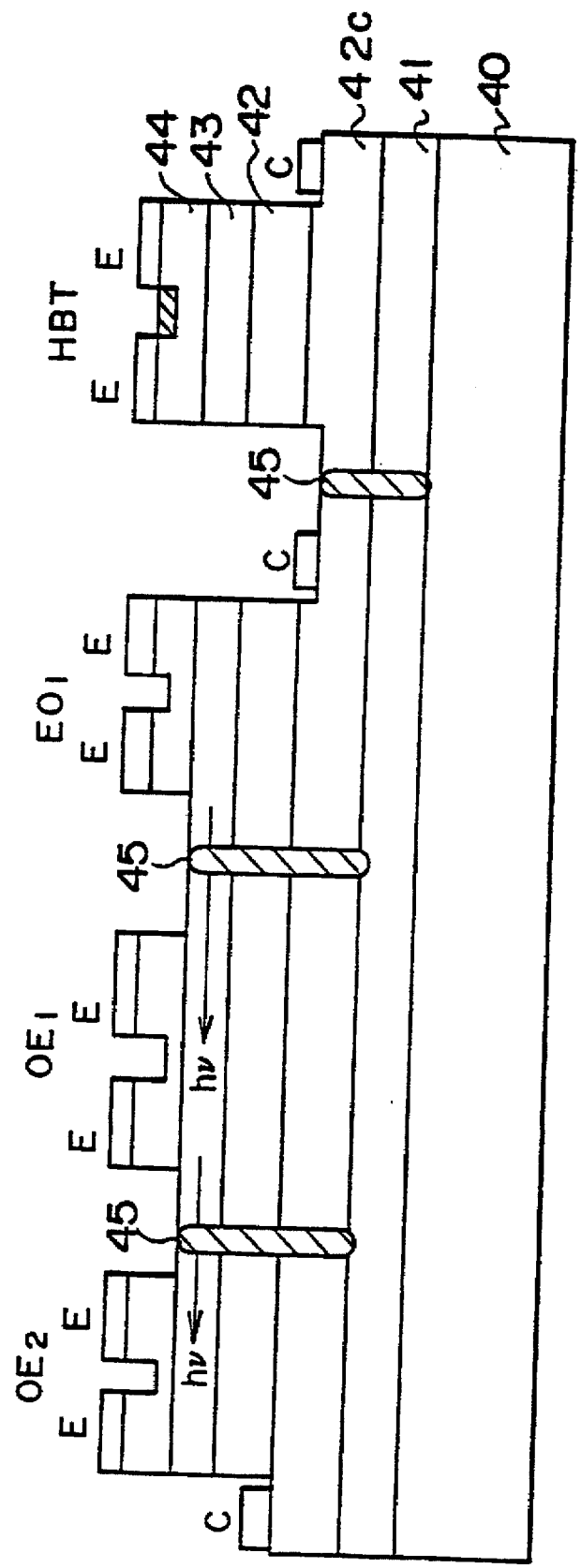
FIG. 21 is a diagram showing the construction of an optical semiconductor integrated circuit according to a sixteenth embodiment of the present invention.

FIG. 21 shows the construction of a semiconductor optical integrated circuit according to a sixteenth embodiment of the present invention. In FIG. 21, those parts described previously with reference to previous embodiments are designated by the same reference numerals and the description thereof will be omitted.

Referring to FIG. 21, it is noted that the device has a structure similar to that of the device of FIG. 20, except that there is provided an HBT of the multiple emitter construction adjacent to the light emitting device $EO_1$ with an isolation trench formed between the HBT and the device $EO_1$. The isolation trench thereby reaches the collector contact layer 42c and exposes the upper major surface thereof, and the isolation region 45 is formed in such an isolation trench to extend from the exposed upper major surface of the collector contact layer 42c to the substrate 40.

By providing such a multiple emitter HBT commonly on the substrate of the optical semiconductor device, it is possible to drive the light emitting device $EO_1$ easily. Such a multiple emitter HBT is suitable for forming an integrated circuit with the optical semiconductor devices $OE_1$, $OE_2$ and $EO_1$, as the HBT has a common layered structure to the devices $OE_1$, $OE_2$ and $EO_1$.

[Seventeenth Embodiment]

Figure 22:
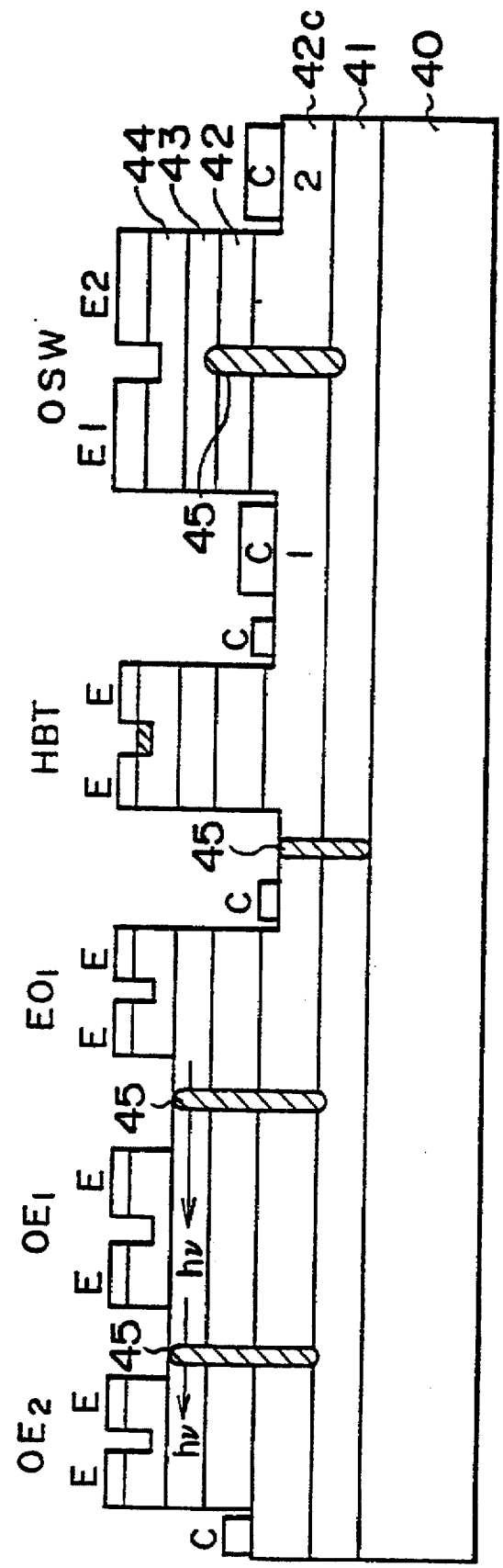
FIG. 22 is a diagram showing the construction of an optical semiconductor integrated circuit according to a seventeenth embodiment of the present invention.

FIG. 22 shows the construction of a semiconductor optical integrated circuit according to a seventeenth embodiment of the present invention. In FIG. 22, those parts described previously with reference to preceding embodiments are designated by the same reference numerals and the description thereof will be omitted.

Referring to FIG. 22, the semiconductor optical integrated circuit has a structure similar to that of FIG. 21, except that there is further provided an optical switch OSW described previously with reference to FIG. 17, such that the optical switch OSW is located adjacent to the HBT. As the optical switch OSW has a layered structure identical to those of the devices $OE_1$, $OE_2$, $EO_1$ and HBT, the optical integrated circuit is fabricated easily.

[Eighteenth Embodiment]

Next, an electro-optical logic device according to an eighteenth embodiment of the present invention will be described with reference to FIG. 23. The electro-optical logic device may for example be used for an optical demultiplexer that extracts an information signal of a desired channel from a time-divisional multiplex signal.

Referring to FIG. 23, there is provided an optical transmitter 51 that transmits an optical signal to an optical signal demultiplexer 53 via an optical fiber 52 in the form of time-divisional multiplex optical signal 54, wherein the optical signal demultiplexer 53 is supplied with an electric clock pulse 55 and carries out a demultiplexing of the signal 54 in response thereto.

More specifically, the demultiplexer 53 converts the input optical signal 54 to an electrical signal and samples the same in response to the clock pulse 54. The signals thus sampled are then supplied to respective output channels in the form of output signals 56. Thus, such an optical demultiplexer 53 generally includes a photoelectric conversion device and a sampling circuit or demultiplexing circuit that carries out a time-divisional demultiplexing of the electric signal converted from the optical signal by the photoelectric conversion device.

Conventionally, various optical semiconductor devices have been used for the photoelectric conversion device, including PIN photodiodes, avalanche photodiodes and phototransistors. However, such conventional photo semiconductor devices have various shortcomings. For example, a PIN photodiode lacks the function of amplifier and requires a cooperating preamplifier in the following stage. On the other hand, an avalanche photodiode requires high operational voltage in the order of 25 volts and tends to introduce noise in the electric output signals. Further, a photodiode, which has a structure of a bipolar transistor equipped with a floating base, has a problem of a slow response due to the accumulation of carries in the base.

In the present embodiment, therefore, the optical semiconductor demultiplexer 53 uses the photodetection device described in any of the fourth through tenth embodiments of the present invention, for the logic device that carries out the sampling of the optical signal. By using such a photodetection device having the construction of multiple emitter bipolar transistor in the operational mode of the tenth embodiment described with reference to FIGS. 14A–14E, a very high speed response is attained for the photodetection and sampling. Further, as noted in the description of the tenth embodiment, such a photodetection device produces the electric output with electric amplification already applied thereto.

Figure 24A:
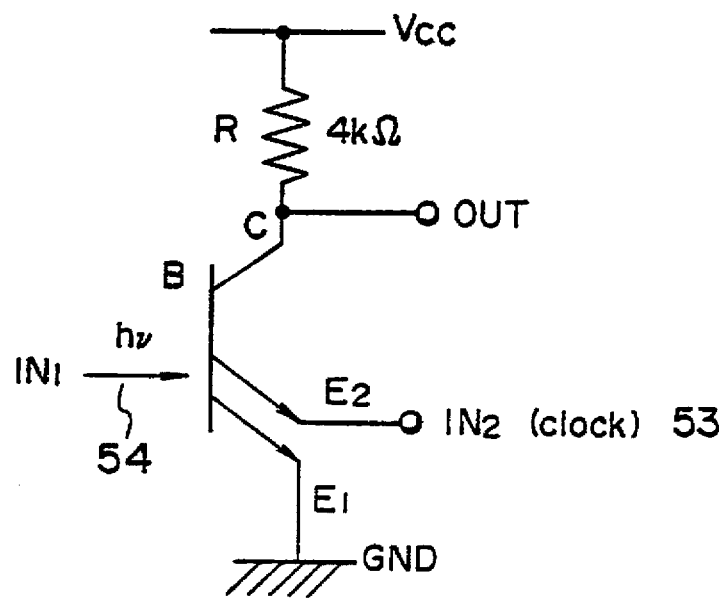
FIGS. 24A and 24B are diagrams respectively showing an equivalent circuit diagram and an operational waveform chart of an optical semiconductor device used in the demultiplexer of FIG. 23 as a sampling device.

FIG. 24A shows the equivalent circuit diagram of the photodetection device of any of the foregoing fourth through tenth embodiments of the present invention as used for a sampling circuit of the optical demultiplexer 53 of FIG. 23.

Referring to FIG. 24A, it will be noted that the first emitter region $E_1$ of the device is grounded, and a bias voltage Vcc is supplied to the collector C of the device via a resistance R set to have a value of 4 kΩ, for example. Further, the photodetection device is supplied with the electric clock signal 53 at the second emitter region $E_2$ as designated by $IN_2$ and further with the incident optical signal 54 at the base region B of the device as designated by $IN_1$. Thereby, the output of the device is obtained at the node where the resistance R and the collector C are connected. The incident optical signal of course has an optical energy sufficient to cause excitation of electrons and holes in the base region B.

Figure 24B:
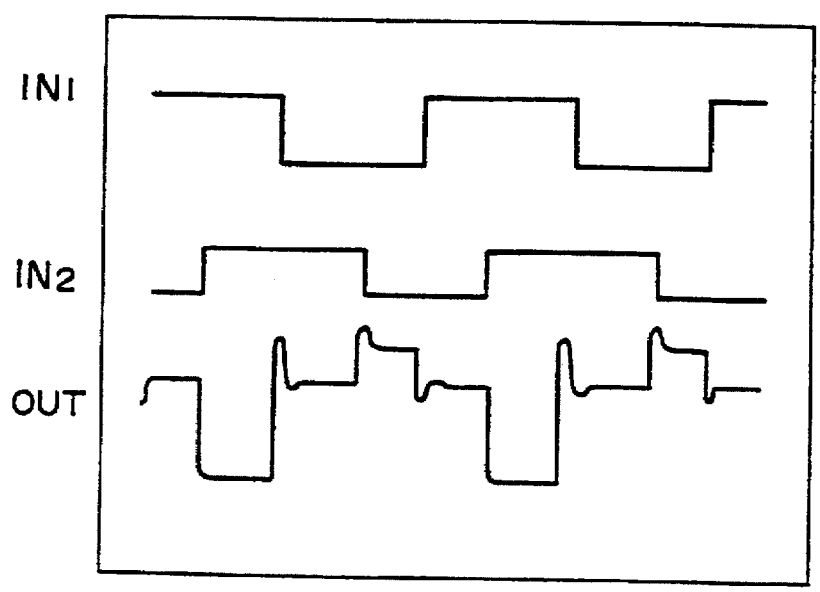

FIG. 24B shows the operation of the device of FIG. 24A.

Referring to FIG. 24B, it will be noted that the device of FIG. 24A produces an output in response to the optical input $IN_1$, in the form of a voltage drop across the resistance R, wherein such a voltage drop occurs only in the high level or positive interval of the electric clock signal $IN_2$. During the low level interval of the clock signal $IN_2$, no such a voltage drop occurs.

The result of FIG. 24B indicates that one can sample the optical signal $IN_1$ in response to the electric clock signal $IN_2$. Further, the result of FIG. 24B indicates that a sampling of the electric signal $IN_2$ is possible by the optical clock pulse $IN_1$. Thereby, it should be noted that the device of FIG. 24A operates as an electro-optical AND gate that produces a logic product of the input optical logic signal $IN_1$ and the input electric logic signal $IN_2$. As already noted with reference to the tenth embodiment of the present invention, the device of FIG. 24A shows an extremely sharp response.

In FIG. 24B, it will be noted that there occurs a small voltage drop in the output of the device of FIG. 24A in response to the high level state of the electric clock signal $IN_2$, even when the input optical signal $IN_1$ is interrupted. The reason of this will be described later with reference to FIG. 25 which shows a relationship between the collector current and the input optical power for a multiple emitter photodetection device shown in FIG. 26.

Thus, before explaining FIG. 25, the structure of the semiconductor device used for the sampling device of FIG. 24A will be described briefly.

Figure 26:
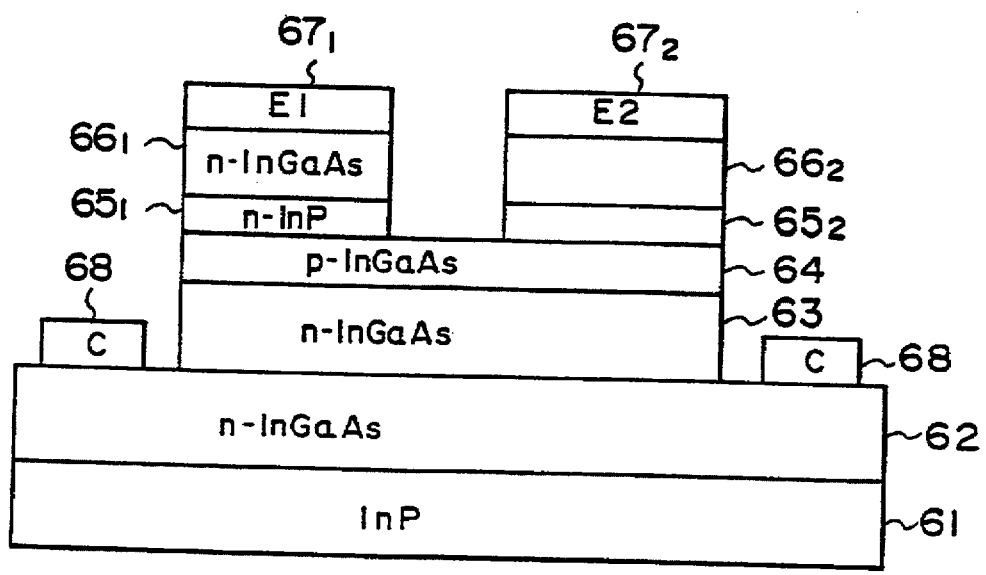
FIG. 26 is a diagram showing the construction of the optical semiconductor device of FIG. 24A in a cross sectional view.

Referring to FIG. 26 first, the device has a structure substantially identical to the structure of the photodetection devices described heretofore and is constructed upon a semi-insulating InP substrate 61, wherein the device includes a collector contact layer 62 of n-type InGaAs provided on the substrate 61 with a thickness of 300 nm and an impurity concentration level of $5 \times 10^{18} \text{cm}^{-3}$, a collector layer 63 of n-type InGaAs provided on the collector contact layer 62 with a thickness of 300 nm and an impurity concentration level of $1 \times 10^{17} \text{cm}^{-3}$ and a base layer 64 of p-type InGaAs provided on the collector layer 63 with a thickness of 80 nm and an impurity concentration level of $5 \times 10^{19} \text{cm}^{-3}$. On the base layer 64, a first emitter region $65_1$ and a second emitter region $65_2$ are formed on respective first and second regions defined on the base layer 64, wherein each of the emitter regions $65_1$ and $65_2$ is formed of n-type InP with a thickness of 150 nm and has an impurity concentration level of $1 \times 10^{19} \text{cm}^{-3}$. On the emitter regions $65_1$ and $65_2$, emitter contact regions $66_1$ and $66_2$ both of n-type InGaAs are provided respectively, wherein each of the regions $66_1$ and $66_2$ has a thickness of 200 nm and is doped to an impurity concentration level of $5 \times 10^{19} \text{cm}^{-3}$. On the emitter contact regions $66_1$ and $66_2$, emitter electrodes $67_1$ and $67_2$ are formed as the first and second emitter electrodes $E_1$ and $E_2$.

Figure 25:
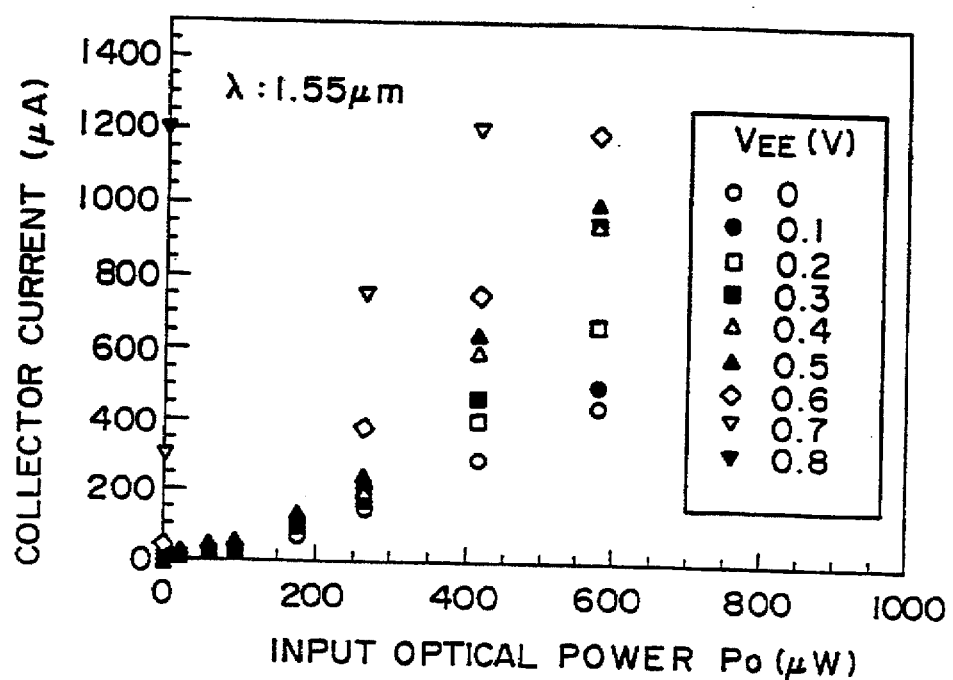
FIG. 25 is a diagram showing the relationship between the collector current and the input optical power of the optical semiconductor device of FIG. 24A.

Referring now to FIG. 25, the horizontal axis represents the optical power $P_0$ of the incident optical beam and the vertical axis represents the collector current, wherein the illustrated example shows the case where the wavelength of the incident optical beam is set to 1.55 μm. In FIG. 25, it should be noted that the relationship between collector current and the input optical power is measured for various voltages $V_{EE}$ applied between the first and second emitter electrodes $E_1$ and $E_2$.

As will be noted in the relationship of FIG. 25, the collector current Ic increases with increasing input optical power, similar to a conventional phototransistor. On the other hand, FIG. 25 shows clearly the feature pertinent to the multiple emitter, open-base photodetection device in that the collector current Ic flows also when the input optical power is zero, if a large voltage is applied between both emitters $E_1$ and $E_2$ as the voltage $V_{EE}$. For example, it will be noted from FIG. 25 that the collector current Ic for the case in which the voltage $V_{EE}$ is set to 0.7 V, is about 300 μA larger than the collector current Ic for the case in which the voltage $V_{EE}$ is set to 0 V, provided that no optical input is applied. On the other hand, the collector current difference between the case in which the voltage $V_{EE}$ is set to 0.7 V and the case in which the voltage $V_{EE}$ is set to 0 V, reaches a value as large as 900 μA when an input optical power of 420 μW is applied to the device.

Thus, by utilizing the foregoing feature, it is possible to construct an electro-optical AND gate that performs a logic product operation between an optical input signal and an electric input signal. For example, one obtains an output collector current Ic of 1200 μA in response to the voltage $V_{EE}$ of 0.7 V corresponding to the high level state of the input optical logic signal and in response to the input electric power of 420 μW corresponding to the high level state of the high level state of the input electric logic signal. When the optical input signal alone is turned off, on the other hand, the output collector current Ic of 300 µA is obtained.

Figure 27:
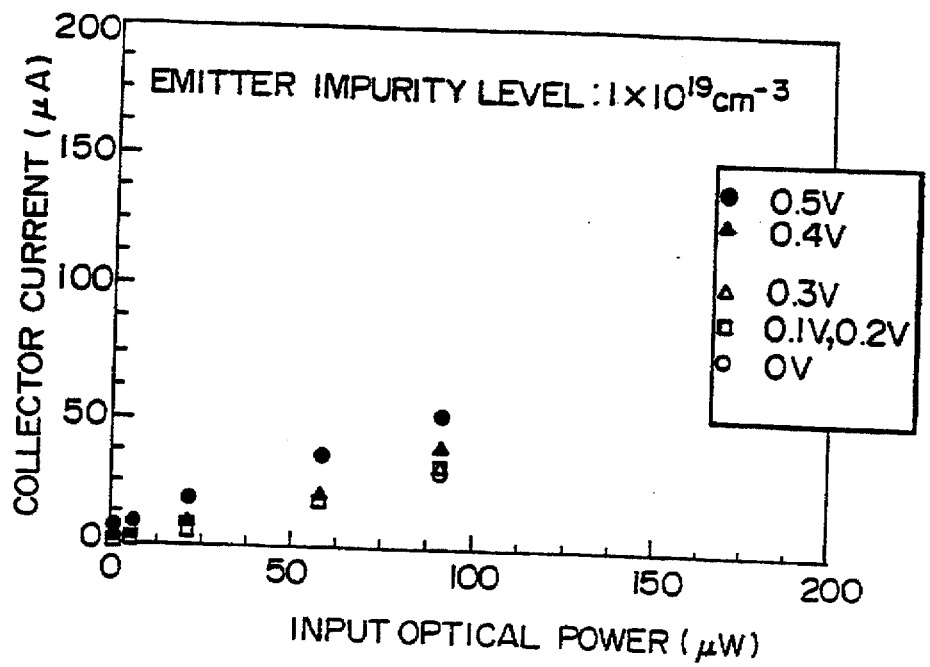
FIG. 27 is a diagram showing the operational characteristics of FIG. 25 in an enlarged scale.

FIG. 27 shows the relationship similar to the one shown in FIG. 25 in an enlarged scale for the region of FIG. 25 where the input optical power is small. Similarly as before, the horizontal axis represents the input optical power $P_0$ while the vertical axis represents the collector current Ic. The wavelength of the optical beam is set to 1.55 µm. In FIG. 27, the voltage $V_{EE}$ is set variously to 0 V, 0.1 V, 0.2 V, 0.3 V, 0.4 V and 0.5 V. In FIG. 27, it will be noted that the device operates with a very low input optical power such as 22 µW, provided that the voltage $V_{EE}$ is set to about 0.5 V, which voltage is comparable to the turn on voltage of the collector current of the multiple emitter HBT.

In the sampling device of the present embodiment for use in the multiple emitter HBT construction of the present embodiment, it will be noted that a certain amount of collector current cannot be avoided when only one of the optical input signal and the electric input signal is supplied to the device. In other words, there occurs an inevitable difference or offset in the collector current between the state in which no optical or electric signals are supplied to the device and the state in which only one of the electric signal and the optical signal is supplied to the device. Such an offset is observed in the output waveform of the device shown in FIG. 24B. While such an offset in the output collector current may not influence the logic operation of the device, there may be a case in which such an offset in the output collector current should be avoided.

In order to avoid the occurrence of such an offset in the output collector current Ic, one may set the voltage $V_{EE}$ smaller than the voltage in which the collector current starts to flow, such as 0.5 V. For example, by setting the voltage $V_{EE}$ to 0.4 V, one may suppress the foregoing offset of the collector current to be less than 1.3 µA in the absence of the input optical signal. In this state, no substantial output current flows through the device. Thereby, the optical power of the input optical signal is set also such that no substantial collector current flows when the optical signal alone is supplied.

In the present embodiment, it will be noted that one can construct an electro-optical OR gate by the device of FIG. 26 by setting the voltage $V_{EE}$ to a sufficiently high level such as 0.7 V and further by setting the input optical power to a sufficiently high level such as 420 µW, such that the device causes a conduction when any one of the optical input signal and the electric input signal is supplied.

[Nineteenth Embodiment]

Figure 28A:
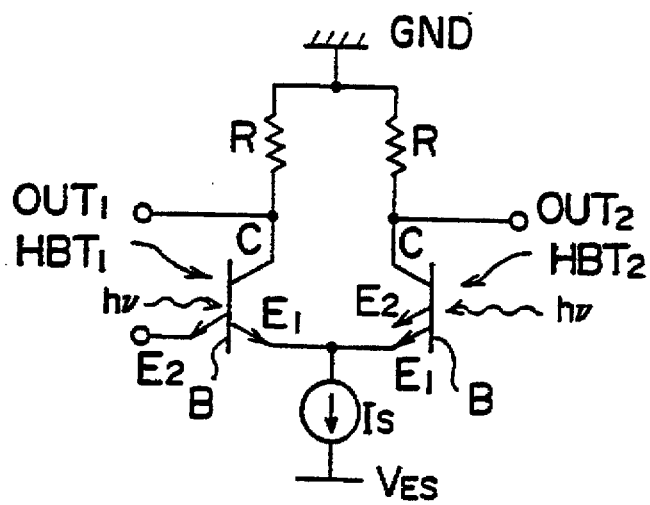
FIGS. 28A–28C are circuit diagrams showing the construction of an optical semiconductor device according to a nineteenth embodiment of the present invention.

FIG. 28A shows the construction of an optical logic circuit that uses the optical semiconductor device having the open-base multiple emitter HBT construction described previously, wherein the optical logic circuit of the present embodiment addresses the problem of the offset in the collector current Ic mentioned previously.

Referring to FIG. 28A, the logic circuit includes, in addition to the optical semiconductor device designated as $HBT_1$, another multiple-emitter open-base HBT designated as $HBT_2$ having a structure identical to the structure of the $HBT_1$, wherein each of the $HBT_1$ and $HBT_2$ has the collector C connected to the ground via a resistor R. Further, the emitter $E_1$ of the $HBT_1$ and the emitter $E_1$ of the $HBT_2$ are connected commonly to a power supply $V_{ES}$ via a common current source $I_0$. Thereby, the second emitter $E_2$ of the $HBT_1$ used for the optical semiconductor device, is supplied with the electric logic signal, while no input is supplied to the second emitter $E_2$ of the $HBT_2$.

In operation, the input optical beam is supplied simultaneously to the base B of both of the $HBT_1$ and $HBT_2$, and the output of the logic circuit is obtained as a difference between the collector voltage of the $HBT_1$ obtained at an output terminal $OUT_1$ and the collector voltage of the $HBT_2$ obtained at an output terminal $OUT_2$. Thus, when an electric logic signal is supplied to the emitter $E_2$ of the $HBT_1$ in addition to the optical logic signal supplied to both of the $HBT_1$ and $HBT_2$, the $HBT_1$ causes a conduction and a voltage drop appears across the output terminals $OUT_1$ and $OUT_2$ as an output of the logic circuit.

On the other hand, when the electric signal alone is supplied to the emitter $E_2$ of the $HBT_1$ without an optical signal, little collector current flows through the device $HBT_1$, provided that the magnitude of the electric signal is set smaller than the threshold voltage at which the collector current starts to flow. Thereby, no substantial voltage drop occurs at the collector C of the $HBT_1$, and the output of the optical logic circuit is held zero.

Further, when an optical input is supplied to the base B of both of the $HBT_1$ and $HBT_2$ without the electric input signal supplied to the emitter $E_2$ of the $HBT_1$, substantially the same collector current flows through both of the $HBT_1$ and $HBT_2$, and no voltage drop appears across the output terminals $OUT_1$ and $OUT_2$.

Of course, the voltage drop across the output terminal $OUT_1$ and $OUT_2$ is zero when there is no optical input and simultaneously there is no electric signal to the emitter $E_2$ of the $HBT_1$.

Figure 28B:
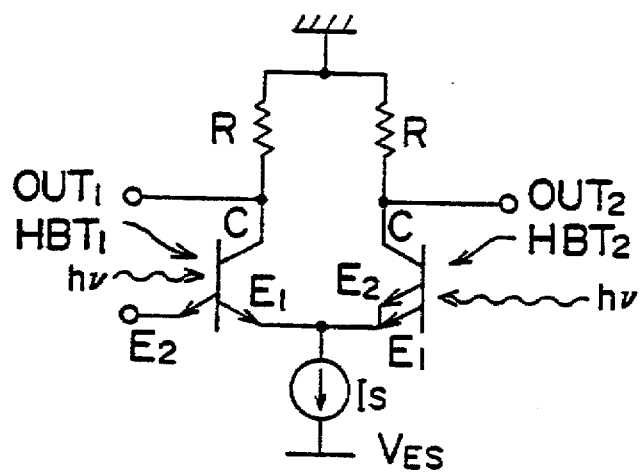

FIG. 28B shows a modification of the circuit of FIG. 28A, wherein the first and second emitters $E_1$ and $E_2$ of the $HBT_2$ are shorted.

Figure 28C:
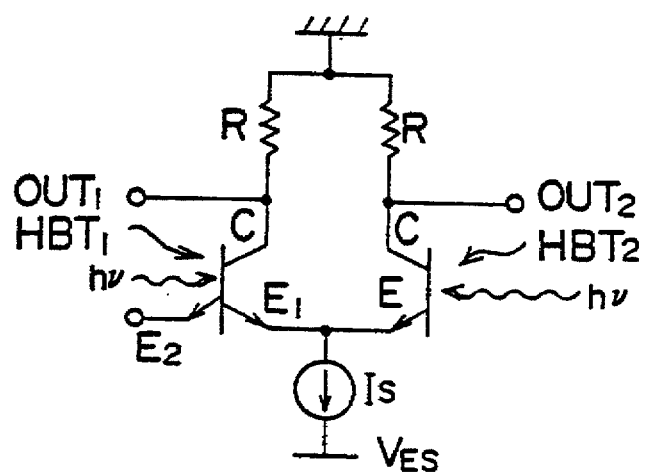

FIG. 28C shows another modification in which a single emitter HBT of a conventional construction is used for the $HBT_2$.

In any of the embodiments of FIGS. 28B and 28C, one can obtain an operation similar to that of the circuit of FIG. 28A.

[Twentieth Embodiment]

Figure 29:
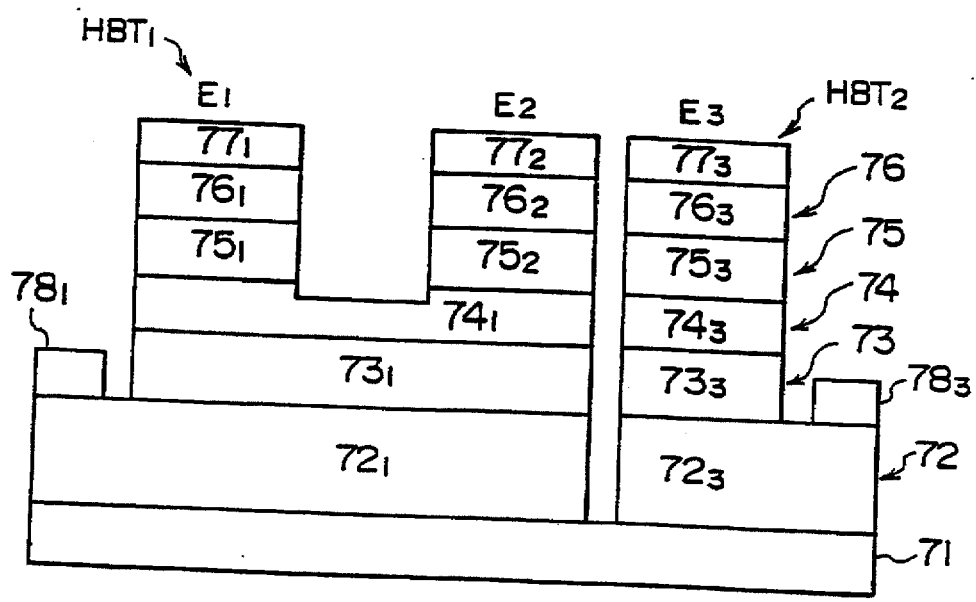
FIG. 29 is a diagram showing the construction of an optical semiconductor device according to a twentieth embodiment of the present invention in a cross sectional view.

FIG. 29 shows a semiconductor device according to a twentieth embodiment of the present invention corresponding to the equivalent circuit diagram of FIG. 28C in which a single emitter HBT is used for the $HBT_2$.

Referring to FIG. 29, the device is constructed upon a semi-insulating InP substrate 71 that carries thereon a collector contact layer 72 of n$^+$-type InGaAs. On the collector contact layer 72, there is provided a collector layer 73 of n-type InGaAs, and a base layer 74 of p-type InGaAs is provided on the collector layer 73. Further, an emitter layer 75 of n-type InP is provided on the base layer 74, and an emitter contact layer 76 of n-type InGaAs is provided on the emitter layer 75. Further, an electrode layer 77 is provided in ohmic contact with the underlying emitter contact layer 76.

The layered structure thus formed including the layers 72–77 is further divided into a first part corresponding to the $HBT_1$ and a second part corresponding to the $HBT_2$ (both of FIG. 28C) by an isolation trench that exposes the surface of the substrate 71, wherein the $HBT_1$ is constructed upon a collector contact layer $72_1$ forming a part of the collector contact layer while the $HBT_2$ is constructed upon a collector contact layer $72_2$ forming another part of the collector contact layer 72. Further, the layers 75–77 are subjected to an etching process to form a groove in the part corresponding to the $HBT_1$ such that the groove thus formed separates the first emitter structure $E_1$ from the second emitter structure $E_2$. It should be noted that the first emitter structure $E_1$ includes a first emitter region $75_1$, a first emitter contact region $76_1$ and a first emitter electrode $77_1$ respectively corresponding to the emitter layer 75, the emitter contact layer 76 and the emitter electrode 77. Similarly, the second emitter structure $E_2$ includes a second emitter region $75_2$, a second emitter contact region $76_2$ and a second emitter electrode $77_2$.

On the other hand, the $HBT_2$ includes a collector region $73_3$, a base region $74_3$, an emitter region $75_3$, an emitter contact region $76_3$ and an emitter electrode $77_3$ respectively corresponding to the foregoing collector layer 73, the base layer 74, the emitter layer 75, the emitter contact layer 76 and the emitter electrode 77. Further, the surface of the collector contact layer $72_1$ is exposed in the $HBT_1$ and a collector electrode $78_1$ is provided thereon. Similarly, the surface of the collector contact layer $72_3$ is exposed and a collector electrode $78_3$ is provided.

Thus, the $HBT_1$ forms a multiple-emitter HBT while the $HBT_2$ forms a single emitter HBT. In other words, the structure of FIG. 29 corresponds to the equivalent circuit diagram of FIG. 28C. Thus, device of FIG. 29 successfully eliminates the problem of offset collector current.

[Twenty-first Embodiment]

Figure 30:
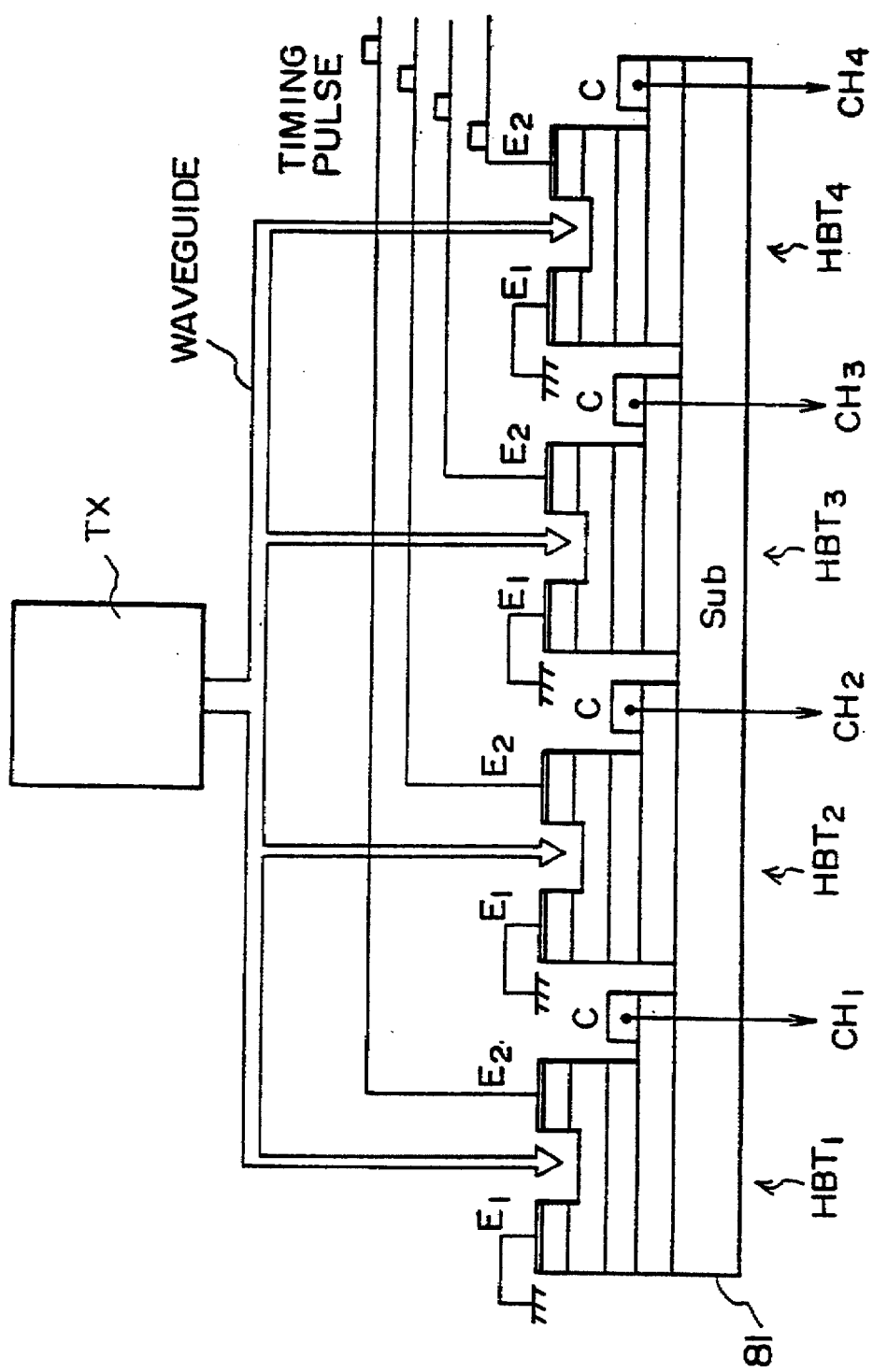
FIG. 30 is a diagram showing the construction of an optical demultiplexer according to a twenty-first embodiment of the present invention.

FIG. 30 shows the construction of a demultiplexer for extracting signals of various channels from a time-divisional multiplex optical signal in which the photodetection device described in any of the preceding embodiments is used.

Referring to FIG. 30, the device has a structure similar to that of FIG. 26 except that a number of the devices $HBT_1$-$HBT_4$ are provided on a common substrate 81 in correspondence to the number of the channels $CH_1$-$CH_4$. In each of the devices, the first emitter $E_1$ is grounded and the other emitter $E_2$ is supplied with a timing pulse in the form of electric signals. Further, an input optical beam is supplied to each of the devices from a common optical source or transmitter designated by TX via an optical waveguide. As each of the devices $HBT_1$-$HBT_4$ has a structure described already with reference to FIG. 26, for example, further description about the structure of the device will be omitted.

In the device of FIG. 30, the optical signal is sampled in each of the devices $HBT_1$-$HBT_4$ in response to the timing pulse supplied thereto, and the outputs of the respective devices are obtained at respective collectors C provided in correspondence to the channel $CH_1$-$CH_4$.

In the device of FIG. 30, it should be noted that one can also demultiplex the electric signals supplied to each of the devices $HBT_1$-$HBT_4$ in response to an optical timing signal.

[Twenty-second Embodiment]

Figure 31:
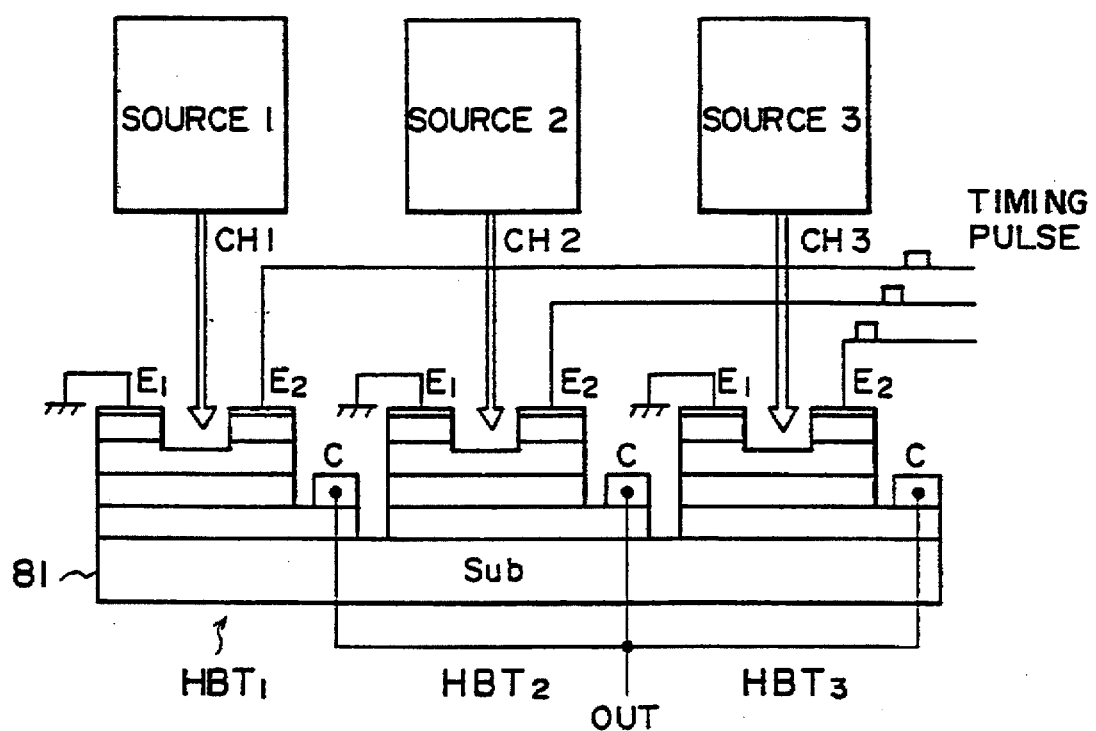
FIG. 31 is a diagram showing the construction of an optical multiplexer according to a twenty-second embodiment of the present invention.

FIG. 31 shows the construction of a multiplexer for multiplexing optical signals of various channels into a single time-divisional multiplex electric signal.

Referring to FIG. 31, there are provided optical signal sources 1-3 in correspondence to the channels $CH_1$-$CH_3$, wherein each of the optical signal sources 1-3 supplies an optical signal to a corresponding sampling device designated as $HBT_1$-$HBT_3$. It should be noted that each of the devices $HBT_1$-$HBT_3$ has the construction described previously for example with reference to FIG. 26 and has the first emitter $E_1$ connected to the ground.

As will be noted in FIG. 31, the optical signals of the channels $CH_1$-$CH_3$ hit the base layer of the corresponding devices $HBT_1$-$HBT_3$ perpendicularly via respective waveguides, while the devices $HBT_1$-$HBT_3$ receive the timing pulses at the respective second emitters $E_2$ with a timing different in each channel. In response to the timing pulse, each of the devices $HBT_1$-$HBT_3$ produces an electric output indicative of the optical signal sampled with the timing of the timing pulse at the collector C, wherein the devices $HBT_1$-$HBT_3$ have the respective collectors C connected commonly with each other. Thereby, a time-divisional multiplex signal is obtained on the output line connected to the foregoing collectors C. Such a time-divisional multiplex signal may for example be used for driving a layer diode to produce a time-divisional multiplex optical signal.

[Twenty-third Embodiment]

In any of the foregoing embodiments, it should be noted that the optical beam applied to the device generally has a diameter of 100 μm or more. Further, it is generally practiced to secure a photoreception area of 100 μm² in order to achieve a satisfactory optical alignment between the optical fiber and the optical semiconductor device. On the other hand, such a construction has a drawback of increased base resistance due to the increased distance between the first emitter region $E_1$ and the second emitter region $E_2$.

Figure 32:
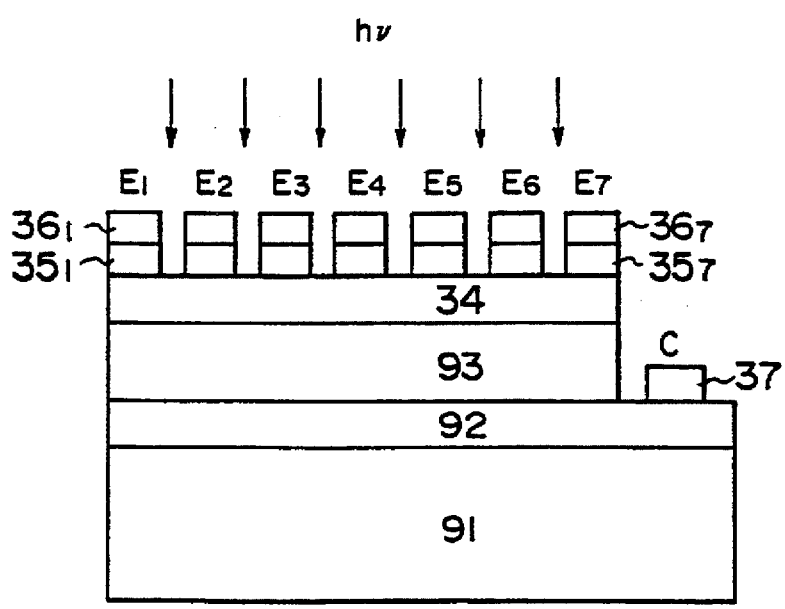
FIG. 32 is a diagram showing the construction of an optical semiconductor device according to a twenty-third embodiment of the present invention.

The present embodiment eliminates the foregoing problem by forming the emitter regions from a number of small emitter elements as indicated in FIG. 32.

Referring to FIG. 32, the optical semiconductor device is constructed upon a substrate 91 that carries thereon a collector contact layer 92, wherein a collector layer 93 is provided on the collector contact layer 92 and a base layer 94 is provided on the collector layer 93. Further, a number of emitter regions $35_1$-$35_7$ are provided on the base layer 94, leaving the exposed surface of the base layer between adjacent emitter regions, and emitter electrodes $36_1$-$36_7$ are provided on the emitter regions $35_1$-$35_7$ respectively. Thereby, the emitter regions $35_1$-$35_7$ and the emitter electrodes $36_1$-$36_7$ thereon form a plurality of emitter regions $E_1$-$E_7$. By using any adjacent emitter regions $E_1$-$E_7$ as the first and second emitters, the device of the present embodiment can detect the optical radiation incident to the device similarly to the previous embodiments.

The construction of FIG. 32 is advantageous for reducing the parasitic resistance between the adjacent emitters while simultaneously securing a sufficient area for photoreception. Further, one can easily form an electronic circuit such as an amplifier by providing an opaque pattern upon selected emitter regions. It should be noted that the structure of FIG. 32 can be formed easily by a photolithographic patterning process.

[Twenty-fourth Embodiment]

Figure 33A:
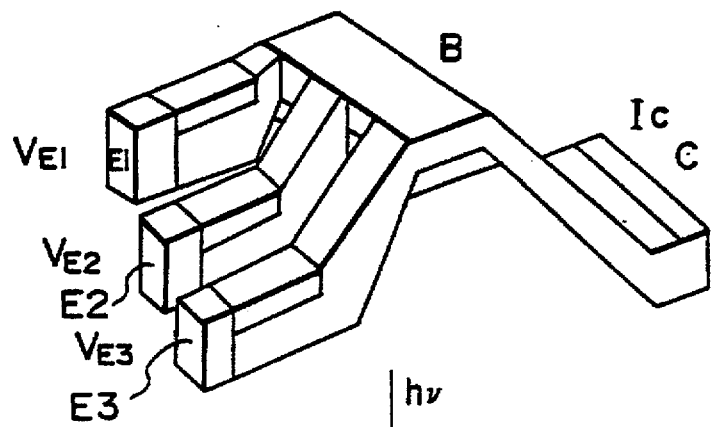
FIGS. 33A–33C are band diagrams showing the operation of the optical semiconductor device according to a twenty-fourth embodiment of the present invention.
Figure 33B:
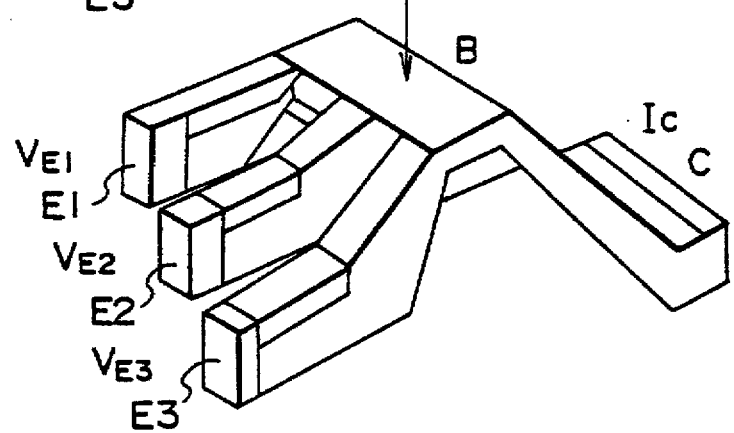
Figure 33C:
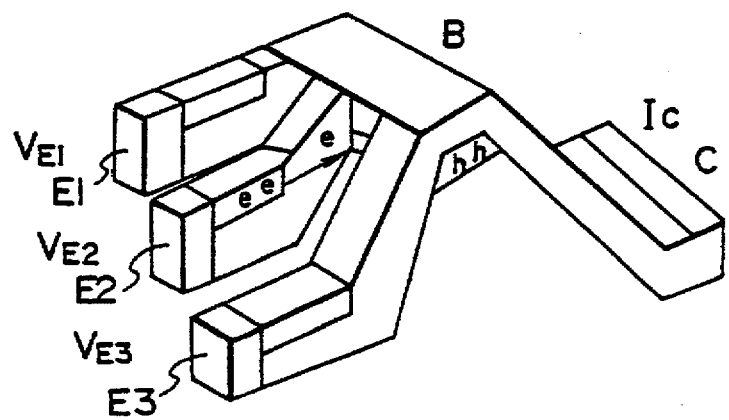

FIGS. 33A-33C show various operational states of an optical semiconductor device of the open-base multiple emitter HBT construction according to a twenty-fourth embodiment of the present invention.

In the present embodiment, the semiconductor device has a structure similar to that of the device of FIG. 26, except that there are provided three emitter regions, $E_1$-$E_3$, on a common base layer. Similarly as before, each of the emitter regions $E_1$-$E_3$ are doped to an impurity concentration level exceeding the density of state of carriers therein. Thereby, any accumulation of holes in the base layer of the device as a result of photodetection is successfully eliminated by injecting electrons from one of the emitters to the base layer by causing an inter-band tunneling.

Referring to FIG. 33A showing a state of the device in which the first emitter $E_1$ is grounded and held at a level $V_{E1}$, it will be noted that the emitter $E_3$ is held at a level $V_{E3}$ lower than the ground level. Further, an intermediate voltage $V_{E2}$ is applied to the emitter $E_2$. In the state of FIG. 33A where no optical radiation is applied, there occurs no excitation of electrons and holes, and no collector current Ic nor a base current flows through the device.

In the state of FIG. 33B, optical radiation is applied to the base region B of the device in the state of FIG. 33A. In response to the optical radiation, there occurs an excitation of electrons and holes in the base region B, wherein the electrons thus excited are caused to flow to the collector C along the sloped conduction band between the base region B and the collector region C in the form of the collector current Ic. Further, the electrons in the base region B are caused to flow to the emitter region $E_3$ in the form of a base current.

In response to such a dissipation of electrons, there occurs an accumulation of the holes in the base region B that acts as a potential well against holes. As a result of such an accumulation of the holes in the base region B, the energy level of the base region B decreases and the electrons start to flow continuously through the base region B from the emitter region $E_1$ to the collector region C in the form of the collector current Ic as well as from the emitter region $E_1$ to the emitter region $E_3$ in the form of the base current.

FIG. 33C shows the state in which the optical radiation is interrupted in the state of FIG. 33B. In the state of FIG. 33B, the level $V_{E2}$ of the second emitter region $E_2$ is set such that the conduction band of the emitter region $E_2$ coincides with the valence band of the base region B. Thereby, the electrons are injected from the conduction band of the emitter region $E_2$ to the valence band of the base region B and annihilate the accumulation of holes therein. Thereby, the device resumes the state illustrated in FIG. 33A immediately.

[Twenty-fifth Embodiment]

Figures 34A, 34B, 34C:
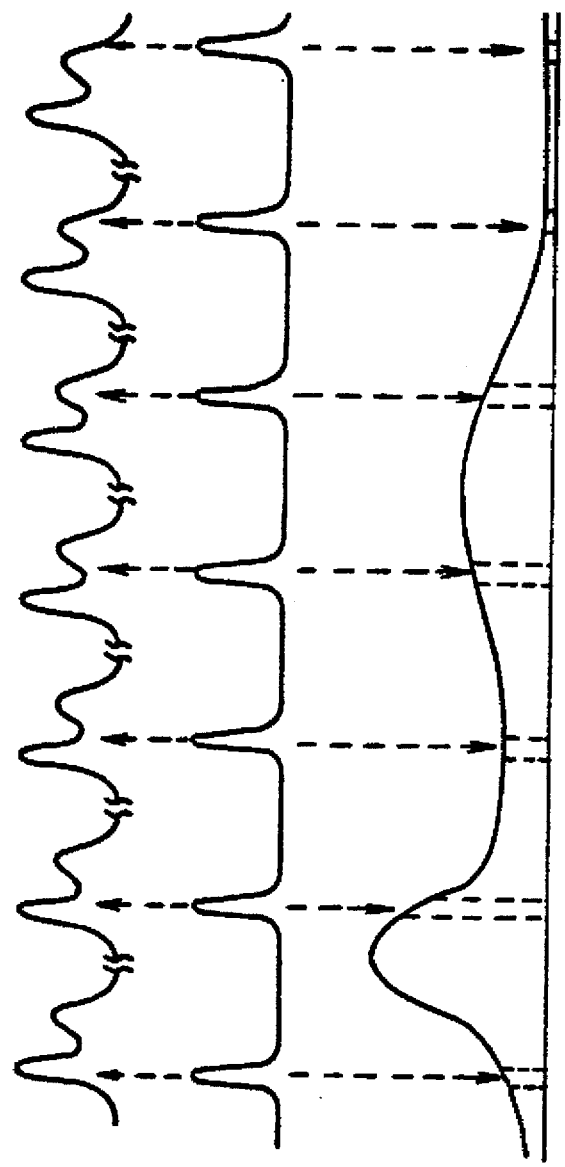
FIGS. 34A–34C are waveform diagrams showing the operation of an optical semiconductor device according to a twenty-fifth embodiment of the present invention.

FIGS. 34A–34C show the sampling process conducted by the optical semiconductor device having the multiple emitter HBT structure according to a twenty-fifth embodiment of the present invention, wherein the semiconductor device may be the one having the circuit diagram shown in FIG. 24A.

Referring to FIGS. 34A–34C, an input electric signal having a waveform shown in FIG. 34A is sampled by an optical sampling pulse shown in FIG. 34B to obtain an output electric signal having the waveform as shown in FIG. 34C, wherein the input electric signal of FIG. 34A has a frequency $nf_0$, while the optical sampling pulse of FIG. 34B has a frequency of repetition of $(f_0 -_\Delta f)$, where n is an integer and $_\Delta f$ is smaller than $f_0$ ($_\Delta f \ll f_0$). As the sampling frequency is offset from the frequency $nf_0$ of the input electric signal, the output signal of FIG. 34C has a frequency $n_\Delta f$ corresponding to the low speed sampling points given as $f_0/_\Delta n$. In doing this, the load resistance is set have a low resistance value such that the change of the collector current Ic is reflected in the output voltage.

Similarly to the circuit diagram shown in FIG. 24A, the present embodiment employs an open-base multiple emitter HBT device having a collector connected to a supply voltage source via a resistance and one of the emitters connected to the ground. Further, another emitter is supplied with the input electric signal shown in FIG. 34A, and the optical sampling signal shown in FIG. 34B is supplied to the base region of the device. The output of the device is obtained at the collector.

Alternatively, one may supply the signal to be sampled to the base region B of the device in the form of an optical signal with a signal frequency $nf_0$ and further a sampling pulse to the emitter $E_2$ (FIG. 24A) with a frequency of repetition of $f_0-_\Delta f$.

[Twenty-sixth Embodiment]

Figure 35:
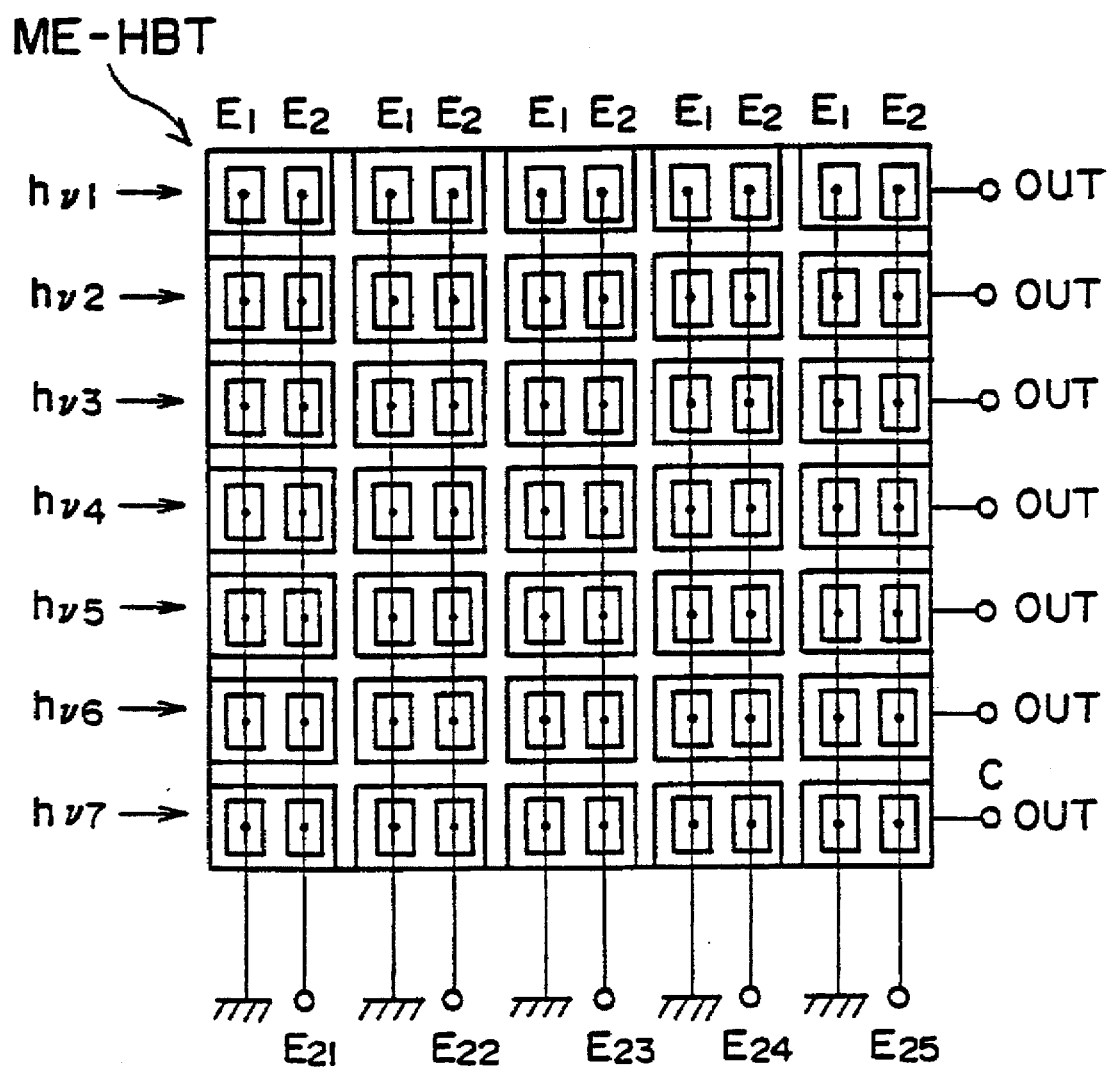
FIG. 35 is a diagram showing the construction of an optical semiconductor device according to a twenty-sixth embodiment of the present invention.

FIG. 35 shows the construction of an optical semiconductor device according to a tenth embodiment of the present invention in a plan view.

Referring to FIG. 35, the semiconductor device includes a number of open-base multiple emitter HBT devices arranged in rows and columns, wherein each of the HBT devices includes the first emitter region $E_1$ and the second emitter region $E_2$, in addition to the base region B and the collector region C similarly to the previous device shown for example in FIG. 26. In the plan view of FIG. 35, the base region B and the collector region C are not shown.

The devices are formed on a common substrate and electrically isolated from each other by an ion implantation of deep impurities conducted into the region between the HBT devices as indicated in FIG. 35. Further, the HBT devices belonging to a row are optically isolated from the devices of other rows, such that each of the input optical beams such as the beam $hv_1$ is received commonly by the HBT devices belonging to a row that corresponds to the input optical beam.

Further, the first emitter regions $E_1$ of the HBT devices belonging to a column are connected commonly to the ground, while the second emitter regions $E_2$ of the same column are connected commonly to an electric input terminal such as $E_{21}$ corresponding to that column. In other words, there are a number of electric input terminals $E_{21}-E_{25}$ in correspondence to the columns.

In operation, the HBT devices experience a conduction in response to the optical signal and the electric signal. In other words, it is possible to select a desired HBT device by the optical signal and the electric signal. By employing such a selection scheme, it is possible to construct a ROM by prohibiting the conduction of selected HBT devices for example by conducting an ion implantation process.

In any of the foregoing embodiments described, it is possible to use other semiconductor systems such as GaAs/AlGaAs junction or Si/SiGe junction for the base-emitter junction. Further, it is possible to induce the desired excitation of electrons and holes by applying an optical radiation to the collector layer in place of the base layer. Further, the HBT device of the present invention is not limited to the npn device but one may also use a pnp device.

Further, the present invention is not limited to the embodiments described heretofore, but various variations and modifications may be made without departing from the scope of the invention.

What is claimed is:

1. A light emitting device, comprising:

a collector layer;

a collector electrode connected electrically to said collector layer;

a base layer provided on said collector layer, said base layer being free from a junction region for contacting with an electrode;

an emitter layer provided on said base layer, said emitter layer including at least two, mutually separated emitter regions; and at least two emitter electrodes provided respectively on said at least two emitter regions.

2. A light emitting device as claimed in claim 1, wherein each of said emitter regions has a bandgap substantially exceeding a bandgap of said base layer.

3. A light emitting device as claimed in claim 1, wherein said base layer has an edge surface covered by an anti-reflection film.

4. A light emitting device as claimed in claim 1, wherein said light emitting device includes an opaque pattern for shielding said base layer from external optical radiation, between said first and second emitter regions.

5. A photodetection device, comprising:

a collector layer;

a collector electrode connected electrically to said collector layer;

a base layer provided on said collector layer, said base layer being free from a junction region for contacting with an electrode;

an emitter layer provided on said base layer, said emitter layer including at least two, mutually separated emitter regions; and at least two emitter electrodes provided respectively on said at least two emitter regions;

said base layer being exposed optically to an external optical radiation.

6. A photodetection device as claimed in claim 5, wherein said photodetection device includes an optical window for passing said external optical radiation to said base layer.

7. A photodetection device as claimed in claim 5, wherein said emitter layer forms an optical window between said at least two, mutually separated emitter regions, for passing said external optical radiation to said base layer.

8. A photodetection device as claimed in claim 5, wherein said base layer carries an anti-reflection film on an edge surface thereof as an optical window for passing said external optical radiation to said base layer.

9. A photodetection device as claimed in claim 5, wherein said emitter layer carries an opaque pattern on a region thereof locating between said at least two emitter regions.

10. A photodetection device as claimed in claim 5, wherein said emitter layer carries an optical filter on a region thereof locating between said at least two emitter regions.

11. A photodetection device as claimed in claim 5, wherein at least one of said emitter electrodes comprises a conductive material transparent to an optical radiation.

12. A photodetection device as claimed in claim 5, wherein said base layer contains an impurity element with an impurity concentration level exceeding a density of state of said base layer, and wherein said emitter layer contains an impurity element with an impurity concentration level exceeding a density of state of said emitter layer.

13. A photodetection device as claimed in claim 5, wherein each of said emitter regions have a bandgap substantially exceeding a bandgap of said base layer.

14. A photodetection device as claimed in claim 5, wherein said emitter layer has a bandgap substantially exceeding a bandgap of said base layer, each of said emitter regions having a composition different from said emitter layer.

15. A photodetection device as claimed in claim 5, wherein said at least one of emitter electrodes establishes a contact with a corresponding emitter region in a state such that a substantial part of said emitter region is exposed.

16. A photodetection device as claimed in claim 5, wherein said photodetection region further includes a Fabry-Pérot resonator.

17. A method for detecting an optical beam by a photodetection device, said photodetection device including: a collector layer; a collector electrode connected electrically to said collector layer; a base layer provided on said collector layer, said base layer being free from a junction region for contacting with an electrode; an emitter layer provided on said base layer, said emitter layer including at least two, mutually separated emitter regions; and at least two emitter electrodes provided respectively on said at least two emitter regions; said base layer being exposed optically to an external optical radiation, said method comprising the steps of:

applying a bias voltage across two of said emitter electrodes; and applying an optical beam to said base layer as said external optical radiation, with an optical energy exceeding a bandgap of said base layer.

18. A method for detecting an optical beam by a photodetection device, said photodetection device including: a collector layer; a collector electrode connected electrically to said collector layer; a base layer provided on said collector layer, said base layer being free from a junction region for contacting with an electrode; an emitter layer provided on said base layer, said emitter layer including at least two, mutually separated emitter regions; and at least two emitter electrodes provided respectively on said at least two emitter regions; said base layer being exposed optically to an external optical radiation, said method comprising the steps of:

applying a bias voltage across one of said emitter electrodes and said collector electrode;

applying an optical beam to said base layer as said external optical radiation, with an optical energy exceeding a bandgap of said base layer; and after interrupting said optical beam, injecting electrons from another emitter electrode to said base layer so as to cancel out accumulation of holes in said base layer.

19. A semiconductor device, comprising:

a plurality of bipolar transistors arranged in rows and columns, each of said bipolar transistors comprising:

a collector layer; a base layer provided on said collector layer, said collector layer being free from a junction region for contacting with an electrode; and an emitter layer provided on said base layer, said emitter layer including a first emitter region and a second emitter region; and optical waveguide means for supplying optical signals such that, in each row of said bipolar transistors, an optical signal is supplied commonly to said base layers; and said first emitter regions of said plurality of bipolar transistors being connected commonly to the ground;

in each column of said plurality of bipolar transistors, said second emitter regions being connected commonly to an input terminal;

in each row of said plurality of bipolar transistors, said collector layers being connected commonly to a power supply terminal.

20. A semiconductor optical integrated circuit, comprising:

a light emitting device including a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said light emitting device producing an optical beam in said base layer thereof; and a photodetection device, comprising: a collector layer, a collector electrode connected electrically to said collector layer, a base layer provided on said collector layer, said base layer being free from a junction region for contacting with an electrode, an emitter layer provided on said base layer, said emitter layer including at least two, mutually separated emitter regions, and at least two emitter electrodes provided respectively on said at least two emitter regions, said photodetection device detecting an optical beam incident to said base layer thereof;

said light emitting device and said photodetection device being provided on a common substrate.

21. A semiconductor optical integrated circuit as claimed in claim 20, wherein said light emitting device and said photodetection device are disposed on said substrate such that said optical beam produced in said base layer of said light emitting device enters said base layer of said photodetection device.

22. A semiconductor optical switch system, comprising:

a semiconductor light emitting device for emitting an optical beam; and a semiconductor photodetection device disposed for detecting said optical beam;

said semiconductor optical switch circuit comprising a collector layer, a base layer provided on said collector layer, said base layer being free from a junction region for contacting with an electrode, and an emitter layer provided on said base layer, said emitter layer including at least two, mutually separated emitter regions;

said semiconductor photodetection device comprising a collector layer, a base layer provided on said collector layer, said base layer being free from a junction region for contacting with an electrode, and an emitter layer provided on said base layer, said emitter layer including at least two, mutually separated emitter regions.

23. A semiconductor optical device comprising:

a collector layer;

a collector electrode connected electrically to said collector layer;

a base layer provided on said collector layer, said base layer being free from a junction region for contacting with an electrode;

an emitter layer provided on said base layer, said emitter layer including at least two, mutually separated emitter regions; and at least two emitter electrodes provided respectively on said at least two emitter regions.

* * * * *